United States Patent
Shiraishi

(10) Patent No.: US 10,658,974 B2
(45) Date of Patent: May 19, 2020

(54) QUADRATURE OSCILLATOR, FSK MODULATOR, AND OPTICAL MODULE

(71) Applicant: FUJITSU LIMITED, Kawasaki-shi, Kanagawa (JP)

(72) Inventor: Takashi Shiraishi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/377,291

(22) Filed: Apr. 8, 2019

(65) Prior Publication Data
US 2019/0326856 A1    Oct. 24, 2019

(30) Foreign Application Priority Data
Apr. 19, 2018    (JP) .................................. 2018-080802

(51) Int. Cl.
| H03B 27/00 | (2006.01) |
| H03B 5/12 | (2006.01) |
| H03C 3/18 | (2006.01) |
| H03L 7/08 | (2006.01) |
| H04B 10/61 | (2013.01) |

(52) U.S. Cl.
CPC .............. *H03B 5/1212* (2013.01); *H03C 3/18* (2013.01); *H03L 7/0807* (2013.01); *H04B 10/612* (2013.01); *H04B 10/613* (2013.01); *H03B 2200/0086* (2013.01); *H03B 2200/0088* (2013.01); *H03B 2201/0216* (2013.01)

(58) Field of Classification Search
CPC ................ H03B 5/1228; H03B 5/1215; H03B 2200/0078; H03B 27/00; H03B 5/06
See application file for complete search history.

(56) References Cited

U.S. PATENT DOCUMENTS

| 9,515,605 | B1 * | 12/2016 | Madala | ............... | H03B 5/1212 |
| 2008/0266005 | A1 * | 10/2008 | Jacobsson | ................ | H03J 3/32 |
| | | | | | 331/108 A |
| 2015/0372643 | A1 * | 12/2015 | Ashckenazi | ......... | H03B 5/1228 |
| | | | | | 455/90.2 |
| 2016/0294440 | A1 * | 10/2016 | Masson | .................... | H03B 5/06 |
| 2018/0175796 | A1 * | 6/2018 | Park | .................... | H03B 5/1212 |
| 2018/0351559 | A1 * | 12/2018 | Shiraishi | .................. | H03B 5/18 |
| 2019/0058441 | A1 * | 2/2019 | Shiraishi | ............... | H04L 7/0331 |
| 2019/0326856 | A1 * | 10/2019 | Shiraishi | ............... | H03B 5/1215 |

FOREIGN PATENT DOCUMENTS

JP    2015-091084    5/2015

\* cited by examiner

*Primary Examiner* — Tanya T Motsinger
(74) *Attorney, Agent, or Firm* — Fujitsu Patent Center

(57) ABSTRACT

A quadrature oscillator includes a first oscillator that outputs a first differential signal, and a second oscillator that outputs a second differential signal having phases that are different from those of the first differential signal, wherein the first oscillator includes a first LC resonator having an inductor and a capacitor coupled in parallel, a first cross-coupled circuit having a first pair of cross-coupled transistors coupled to the first LC resonator, a first tail current source coupled to the first pair of transistors, first input differential pair transistors to which the second differential signal is to be input, and a first pair of harmonic resonators disposed in input sections of the first input differential pair transistors, the first pair of the harmonic resonators have a resonance frequency of an odd multiple of a resonance frequency of the first oscillator.

13 Claims, 30 Drawing Sheets

FIG. 18

| CIRCUIT CONFIGURATION | CIRCUIT DIAGRAM |
|---|---|
| L1 (FIRST LAYER) <br> L1 (SECOND LAYER) | L1 <br> L2 |

QUADRATURE OSCILLATOR, FSK MODULATOR, AND OPTICAL MODULE

CROSS-REFERENCE TO RELATED APPLICATION

This application is based upon and claims the benefit of priority of the prior Japanese Patent Application No. 2018-80802, filed on Apr. 19, 2018, the entire contents of which are incorporated herein by reference.

FIELD

The embodiments discussed herein are related to a quadrature oscillator, a frequency shift keying (FSK) modulator, and an optical module.

BACKGROUND

A quadrature oscillator that uses LC resonators, each consisting of an inductor (L) and a capacitor (C) connected in parallel, to produce four-phase clocks of different phases by LC resonance is known. Quadrature oscillators may be used, for example, in FSK modulators and Clock and Data Recovery (CDR) circuits that are used for the high-speed interconnection for sending and receiving data at high speed by wired or wireless communication. FSK modulators are circuits that vary frequencies of carrier waves in accordance with data. CDR circuits recover a clock and data from a data signal in which the clock is superimposed.

Widening a variable range (range in which the capacitance varies) of a variable capacitor in an LC resonator widens the range in which a quadrature oscillator oscillates. The wider oscillation range of the quadrature oscillator enables the quadrature oscillator to cover a plurality of oscillation frequencies (for example, 25 GHz and 28 GHz, or 32 GHz and 36 GHz) with one quadrature oscillator without using a plurality of quadrature oscillators for respective frequencies.

The greater variable capacitance, however, decreases the Q value (quality factor) that indicates the performance of the LC resonator, for example, increases the noise in the clock. The increase in the variable capacitance due to the greater variable capacitance may cause unignorable parasitic capacitance and thereby the oscillation range may become narrow.

The following is a reference document. [Document 1] Japanese Laid-open Patent Publication No. 2015-91084.

SUMMARY

According to an aspect of the embodiments, a quadrature oscillator includes a first oscillator that outputs a first differential signal, and a second oscillator that outputs a second differential signal having phases that are different from those of the first differential signal, wherein the first oscillator includes a first LC resonator having an inductor and a capacitor coupled in parallel, a first cross-coupled circuit having a first pair of cross-coupled transistors coupled to the first LC resonator, a first tail current source coupled to the first pair of transistors, first input differential pair transistors to which the second differential signal is to be input, and a first pair of harmonic resonators disposed in input sections of the first input differential pair transistors, the second oscillator includes a second LC resonator having an inductor and a capacitor coupled in parallel, a second cross-coupled circuit having a second pair of cross-coupled transistors coupled to the second LC resonator, a second tail current source coupled to the second pair of transistors, second input differential pair transistors to which the first differential signal is to be input, and a second pair of harmonic resonators disposed in input sections of the second input differential pair transistors, the first pair of the harmonic resonators have a resonance frequency of an odd multiple of a resonance frequency of the first oscillator, and the second pair of the harmonic resonators have a resonance frequency of an odd multiple of a resonance frequency of the second oscillator.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 18 illustrates an example inductance variable circuit.

DESCRIPTION OF EMBODIMENTS

Hereinafter, embodiments will be described with reference to the attached drawings.

Figure 1:
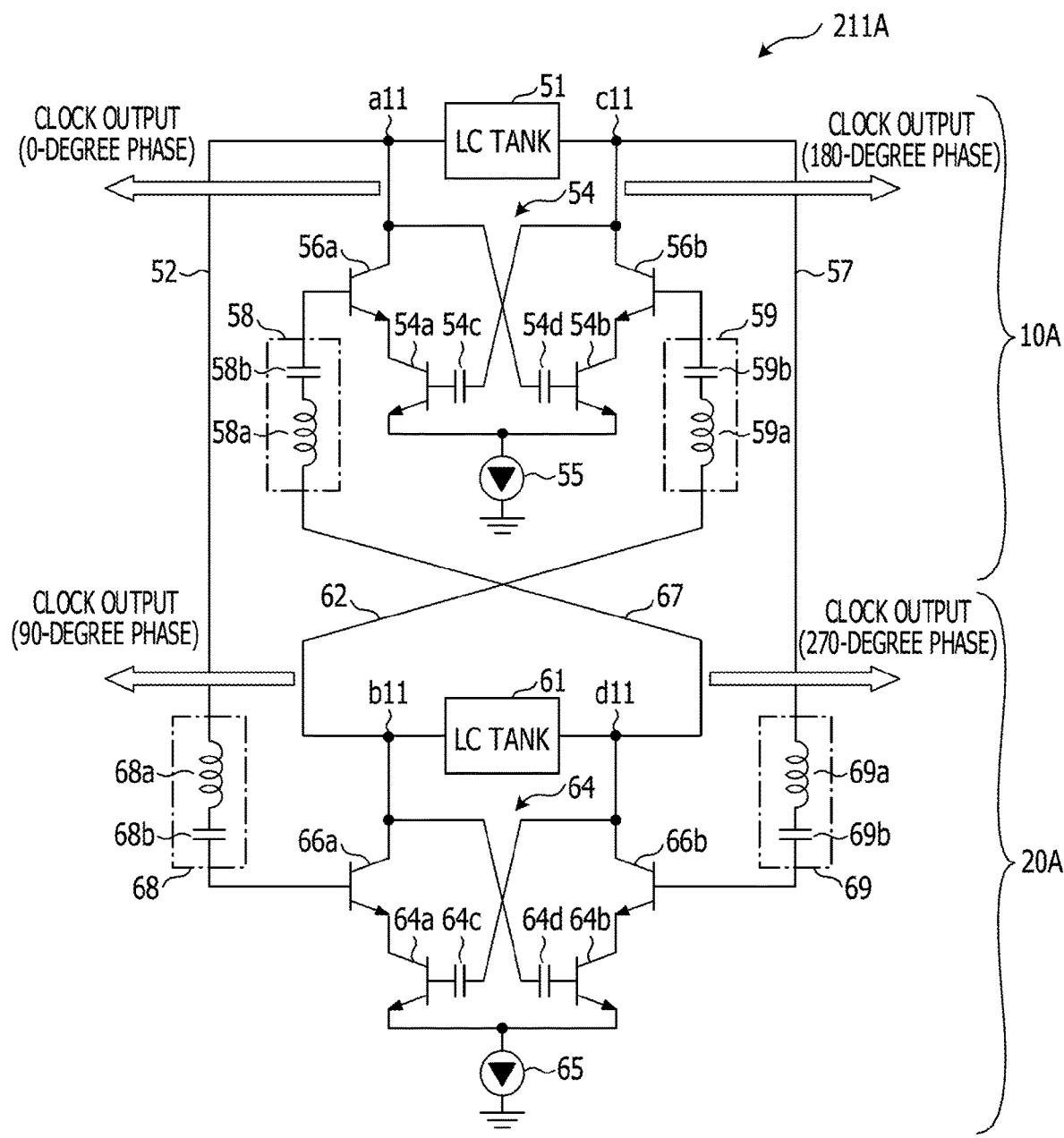
FIG. 1 illustrates an example configuration of a quadrature oscillator according to a first embodiment.

FIG. 1 illustrates an example configuration of a quadrature oscillator according to a first embodiment. A quadrature oscillator 211A includes an I-phase oscillator 10A that outputs an I-phase differential signal that has phases different from each other by 180 degrees and a Q-phase oscillator 20A that outputs a Q-phase differential signal that has phases different from the phases of the first I-phase differential signal by 90 degrees or −90 degrees. The I-phase differential signal is an example first differential signal, and the Q-phase differential signal is an example second differential signal.

The I-phase oscillator 10A is an example first oscillator that outputs the first I-phase differential signal. The I-phase oscillator 10A includes an LC tank 51 that has an I-phase coil, and outputs an I-phase differential signal from a pair of nodes a11 and c11 that are located at both sides of the I-phase coil of the LC tank 51. For example, a 0-degree clock that is one of the I-phase differential signal is output from the node a11, and a 180-degree clock that is the other one of the I-phase differential signal is output from the node c11.

The Q-phase oscillator 20A is an example second oscillator that outputs a second Q-phase differential signal having phases that are different from those of the first differential signal. The Q-phase oscillator 20A includes an LC tank 61 that has a Q-phase coil, and outputs a Q-phase differential signal from a pair of nodes b11 and d11 that are located at both sides of the Q-phase coil of the LC tank 61. For example, a 90-degree clock that is one of the Q-phase differential signal is output from the node b11, and a 270-degree clock that is the other one of the Q-phase differential signal is output from the node d11.

For example, the 90-degree clock output from the node b11 lags 90 degrees behind the 0-degree clock output from the node a11. The 180-degree clock output from the node c11 lags 90 degrees behind the 90-degree clock output from the node b11. The 270-degree clock output from the node d11 lags 90 degrees behind the 180-degree clock output from the node c11.

The I-phase oscillator 10A includes the LC tank 51, a cross-coupled circuit 54, a tail current source 55, first input differential pair transistors 56a and 56b, capacitors 54c and 54d, and a pair of harmonic resonators 58 and 59.

The LC tank 51 is an example first LC resonator that has an inductor and a capacitor connected in parallel. The cross-coupled circuit 54 is an example first cross-coupled circuit. The cross-coupled circuit 54 has a pair of cross-coupled transistors 54a and 54b that are connected to the LC tank 51. The pair of the transistors 54a and 54b are an example first pair of transistors. The tail current source 55 is an example first tail current source, and connected to the pair of the transistors 54a and 54b. To the first input differential pair transistors 56a and 56b, the Q-phase differential signal is input. The pair of the harmonic resonators 58 and 59 are an example first pair of harmonic resonators. The pair of the harmonic resonators 58 and 59 are located in input sections of the first input differential pair transistors 56a and 56b.

The Q-phase oscillator 20A includes the LC tank 61, a cross-coupled circuit 64, a tail current source 65, second input differential pair transistors 66a and 66b, capacitors 64c and 64d, and a pair of harmonic resonators 68 and 69.

The LC tank 61 is an example second LC resonator that has an inductor and a capacitor connected in parallel. The cross-coupled circuit 64 is an example second cross-coupled circuit. The cross-coupled circuit 64 has a pair of the cross-coupled transistors 64a and 64b that are connected to the LC tank 61. The pair of the transistors 64a and 64b are an example second pair of transistors. The tail current source 65 is an example second tail current source, and connected to the pair of the transistors 64a and 64b. To the second input differential pair transistors 66a and 66b, a first I-phase differential signal is input. The pair of the harmonic resonators 68 and 69 are an example second pair of harmonic resonators. The pair of the harmonic resonators 68 and 69 are located in input sections of the second input differential pair transistors 66a and 66b.

The first input differential pair transistors 56a and 56b are connected in series to the first pair of the transistors 54a and 54b. The second input differential pair transistors 66a and 66b are connected in series to the second pair of the transistors 64a and 64b.

The I-phase oscillator 10A includes a pair of output terminals a11 and c11 that outputs an I-phase differential signal. The Q-phase oscillator 20A includes a pair of output terminals b11 and d11 that outputs a Q-phase differential signal. The LC tank 51 is connected between the first output terminal a11 and the second output terminal c11. The LC tank 61 is connected between the third output terminal b11 and the fourth output terminal d11.

The first transistor 54a, which is connected to the first output terminal a11 via the transistor 56a, and the second transistor 54b, which is connected to the second output terminal c11 via the transistor 56b, are transistors for oscillation. In the first transistor 54a, the base is connected to the second output terminal c11 via the capacitor 54c, the collector is connected to the first output terminal a11 via the transistor 56a, and the emitter is connected to the tail current source 55. In the second transistor 54b, the base is connected to the first output terminal a11 via the capacitor 54d, the collector is connected to the second output terminal c11 via the transistor 56b, and the emitter is connected to the tail current source 55.

The tail current source 55 supplies a first tail current to the pair of the transistors 54a and 54b in the cross-coupled circuit 54. The value of the first tail current represents a current value of a tail current for oscillation. The tail current source 55 is connected between a common junction point of the emitters of the pair of the transistors 54a and 54b and a ground.

An input differential pair is configured with the third transistor 56a, which is connected to the first transistor 54a in series and connected to the fourth output terminal d11, and the fourth transistor 56b, which is connected to the second transistor 54b in series and connected to the third output terminal b11. The input differential pair represents transistors for injection. In the third transistor 56a, the base is connected to the fourth output terminal d11 via a line 67, the collector is connected to the first output terminal a11, and the emitter is connected to the collector of the transistor 54a. In the fourth transistor 56b, the base is connected to the third output terminal b11 via a line 62, the collector is connected to the second output terminal c11, and the emitter is connected to the collector of the transistor 54b.

The fifth transistor 64a, which is connected to the third output terminal b11 via the transistor 66a, and the sixth transistor 64b, which is connected to the fourth output terminal d11 via the transistor 66b, are transistors for oscillation. In the fifth transistor 64a, the base is connected to the fourth output terminal d11 via the capacitor 64c, the collector is connected to the third output terminal b11 via the transistor 66a, and the emitter is connected to the tail current source 65. In the sixth transistor 64b, the base is connected to the third output terminal b11 via the capacitor 64d, the collector is connected to the fourth output terminal d11 via the transistor 66b, and the emitter is connected to the tail current source 65.

The tail current source 65 supplies a second tail current to the pair of the transistors 64a and 64b in the cross-coupled circuit 64. The value of the second tail current represents a current value of a tail current for oscillation. The tail current source 65 is connected between a common junction point of the emitters of the pair of the transistors 64a and 64b and a ground.

An input differential pair is configured with the seventh transistor 66a, which is connected to the fifth transistor 64a in series and connected to the first output terminal a11, and the eighth transistor 66b, which is connected to the sixth transistor 64b in series and connected to the second output terminal c11. The input differential pair represents transistors for injection. In the seventh transistor 66a, the base is connected to the first output terminal a11 via a line 52, the collector is connected to the third output terminal b11, and the emitter is connected to the collector of the transistor 64a. In the eighth transistor 66b, the base is connected to the second output terminal c11 via a line 57, the collector is connected to the fourth output terminal d11, and the emitter is connected to the collector of the transistor 64b.

Each of the transistors 54a, 54b, 56a, 56b, 64a, 64b, 66a, and 66b is, for example, an npn bipolar transistor. Each of the transistors may be an N-channel metal oxide semiconductor field-effect transistor (MOSFET). In such a case, the base corresponds to the gate, the collector corresponds to the drain, and the emitter corresponds to the source.

Figure 2:
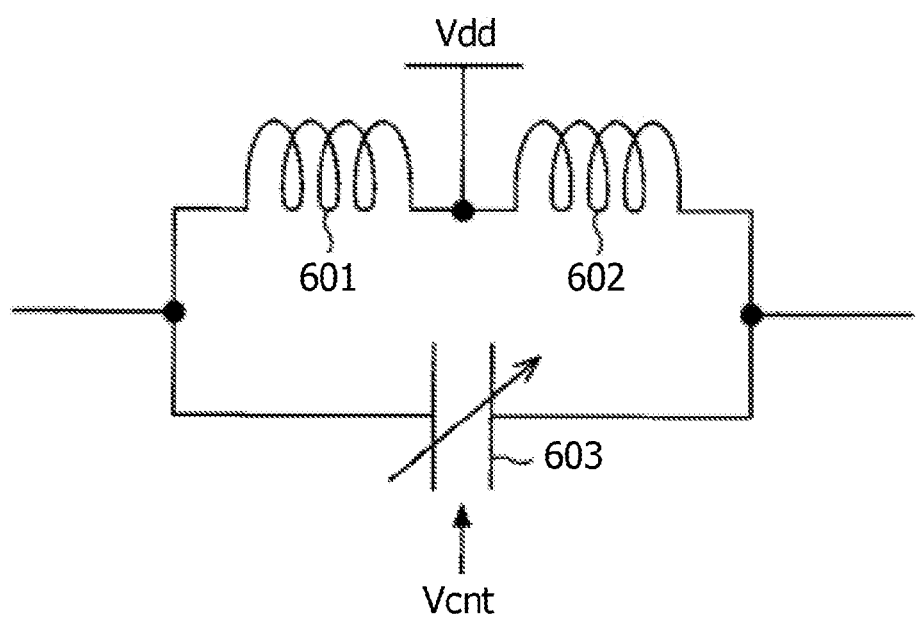
FIG. 2 illustrates an example configuration of an LC tank.

FIG. 2 illustrates a configuration of an LC tank. The LC tank illustrated in FIG. 2 is an example of the LC tanks 51 and 61 illustrated in FIG. 1. The LC tank has an inductor and a capacitor connected in parallel. The inductor includes a coil section 601 and a coil section 602, and is connected to a power line of a power source voltage Vdd between the coil section 601 and the coil section 602. One output terminal is connected to the power line of the power source voltage Vdd via the coil section 601 and the other output terminal is connected to the power line of the power source voltage Vdd via the coil section 602. A capacitor 603 is, for example, a variable capacitor that varies its capacitance in accordance with a control voltage Vcnt. The capacitor 603 may be a varactor or a variable capacitance diode.

An operation of the quadrature oscillator 211A in FIG. 1 will be described with a flow of a clock voltage signal from/to the output terminal a11. A 0-degree clock output from the output terminal a11 is injected into the Q-phase transistor 66a and a 90-degree clock whose phase is delayed with respect to the 0-degree clock by 90 degrees is output from the output terminal b11. The 90-degree clock output from the output terminal b11 is injected into the I-phase transistor 56b and a 180-degree clock whose phase is delayed with respect to the 90-degree clock by 90 degrees is output from the output terminal c11. The 180-degree clock output from the output terminal c11 is injected into the Q-phase transistor 66b and a 270-degree clock whose phase is delayed with respect to the 180-degree clock by 90 degrees is output from the output terminal d11. The 270-degree clock output from the output terminal d11 is injected into the I-phase transistor 56a and a 0-degree clock whose phase is delayed with respect to the 270-degree clock by 90 degrees is output from the output terminal a11.

The pair of harmonic resonators 58 and 59 are set to have a resonance frequency of an odd multiple of the resonance frequency of the LC tank 51. The pair of harmonic resonators 68 and 69 are set to have a resonance frequency of an odd multiple of the resonance frequency of the LC tank 61. In this embodiment, the LC tanks 51 and 61 are set to have the same resonance frequency $\omega_0$, and the harmonic resonators 58, 59, 68, and 69 have the same resonance frequency ($N \times \omega_0$) (N is an odd number). In other words, the harmonic resonators 58, 59, 68, and 69 resonate at the same resonance frequency ($N \times \omega_0$).

The harmonic resonator 58 according to the embodiment is inserted in the line 67 in series and the base of the transistor 56a is connected to the output terminal d11 via the harmonic resonator 58. The harmonic resonator 59 is inserted in the line 62 in series and the base of the transistor 56b is connected to the output terminal b11 via the harmonic resonator 59. The harmonic resonator 68 is inserted in the line 52 in series and the base of the transistor 66a is connected to the output terminal a11 via the harmonic resonator 68. The harmonic resonator 69 is inserted in the line 57 in series and the base of the transistor 66b is connected to the output terminal c11 via the harmonic resonator 69.

Each of the harmonic resonators 58, 59, 68, and 69 according to the embodiment has an inductor and a capacitor that are connected in series. Each of inductors 58a, 59a, 68a, and 69a of the harmonic resonators 58, 59, 68, and 69 may be an inductive element such as a coil or an inductance component in the line, or both of the inductive element and the inductance component. Each of the capacitors 58b, 59b, 68b, and 69b of the harmonic resonators 58, 59, 68, and 69 may be a capacitive element that is inserted in a corresponding line in series or capacitance between the base and the collector of each of the injection transistors 56a, 56b, 66a, and 66b, or the capacitance in the line. The capacitance between the base and the collector of each of the transistors 56a, 56b, 66a, and 66b may be parasitic capacitance.

Figure 3:
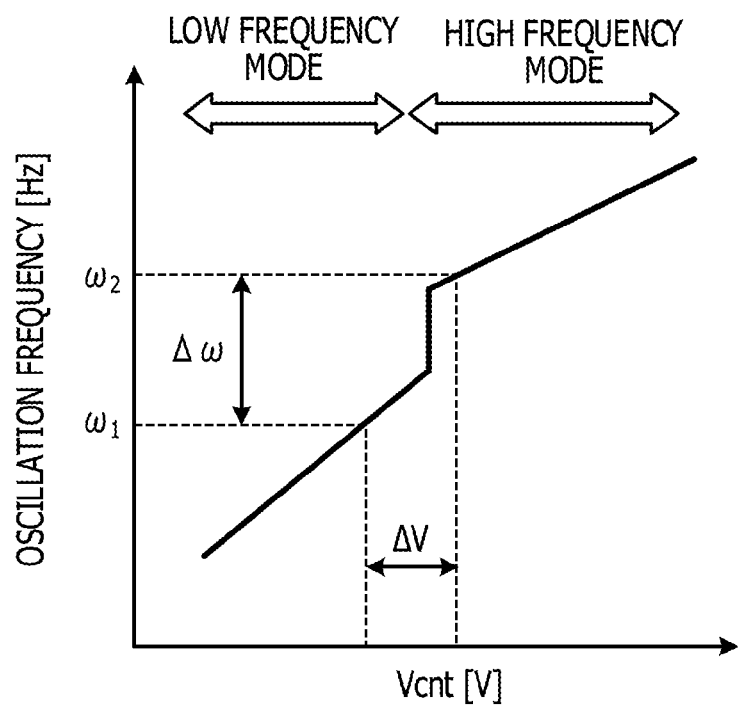
FIG. 3 illustrates an example of a characteristic curve of the quadrature oscillator according to the first embodiment.

FIG. 3 illustrates an example of a characteristic curve of the quadrature oscillator according to the first embodiment. With the configuration according to the embodiment, a characteristic curve having at least two inflection points as illustrated in FIG. 3 is obtained. The characteristic curve represents a relationship between the control voltage Vcnt applied to the capacitors 603 of the LC tanks 51 and 61 and the oscillation frequency $\omega$ of the quadrature oscillator 211A. The oscillation frequency $\omega$ is a frequency of a four-phase clock (I-phase differential signal and Q-phase differential signal) output from the quadrature oscillator. When the control voltage Vcnt increases and exceeds a threshold value, the oscillation frequency $\omega$ rapidly skips to the side the oscillation frequency $\omega$ increases, and the oscillation mode of the quadrature oscillator 211A is switched from a low frequency mode to a high frequency mode. On the other hand, when the control voltage Vcnt decreases and exceeds a threshold value, the oscillation frequency ω rapidly skips to the side the oscillation frequency ω decreases, and the oscillation mode of the quadrature oscillator 211A is switched from the high frequency mode to the low frequency mode. In other words, the quadrature oscillator 211A has a characteristic that the oscillation frequency ω skips (shifts) between the two oscillation modes depending on the magnitude of the control voltage Vcnt.

Figure 4:
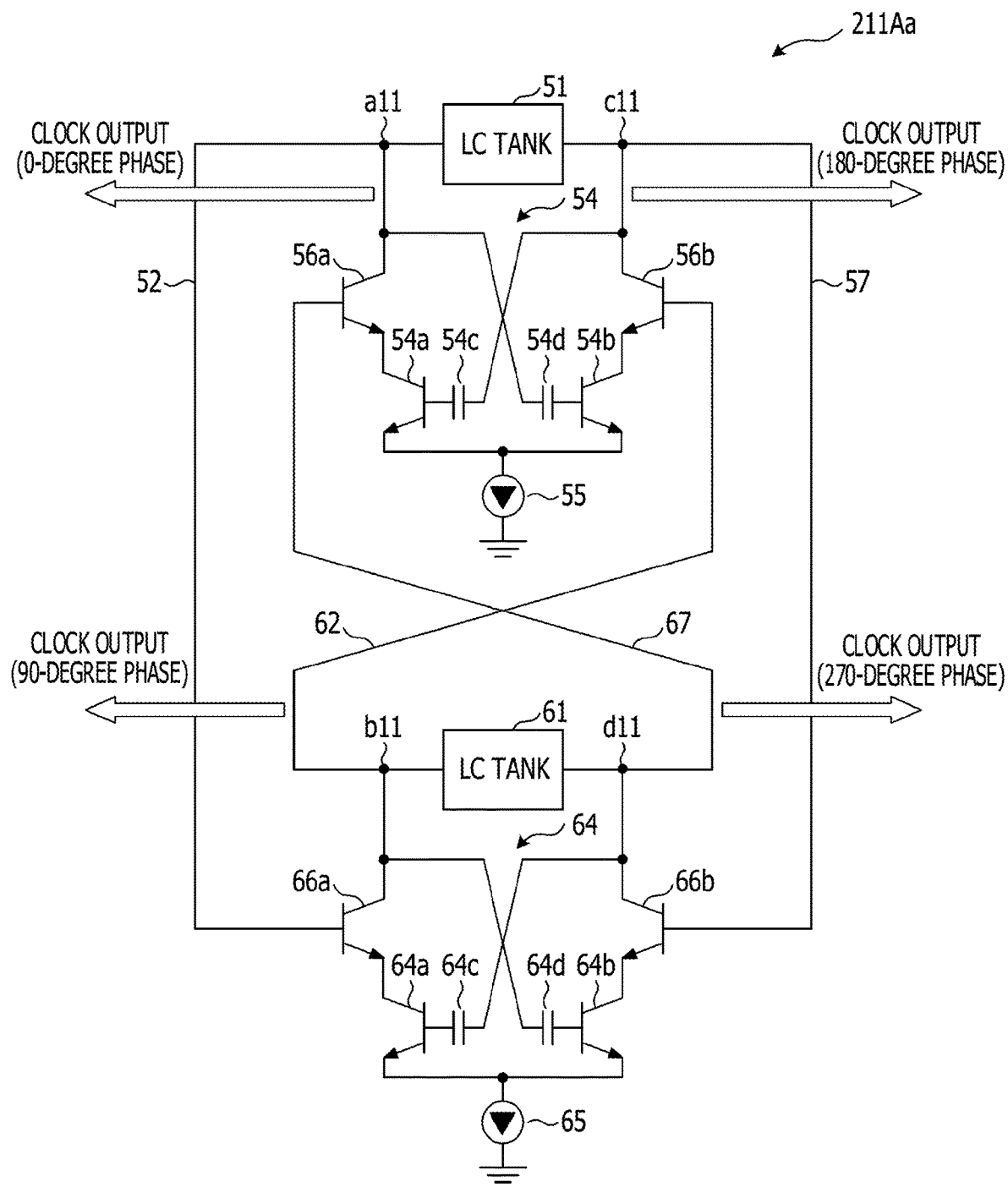
FIG. 4 illustrates an example configuration of a quadrature oscillator according to a comparative example.
Figure 5:
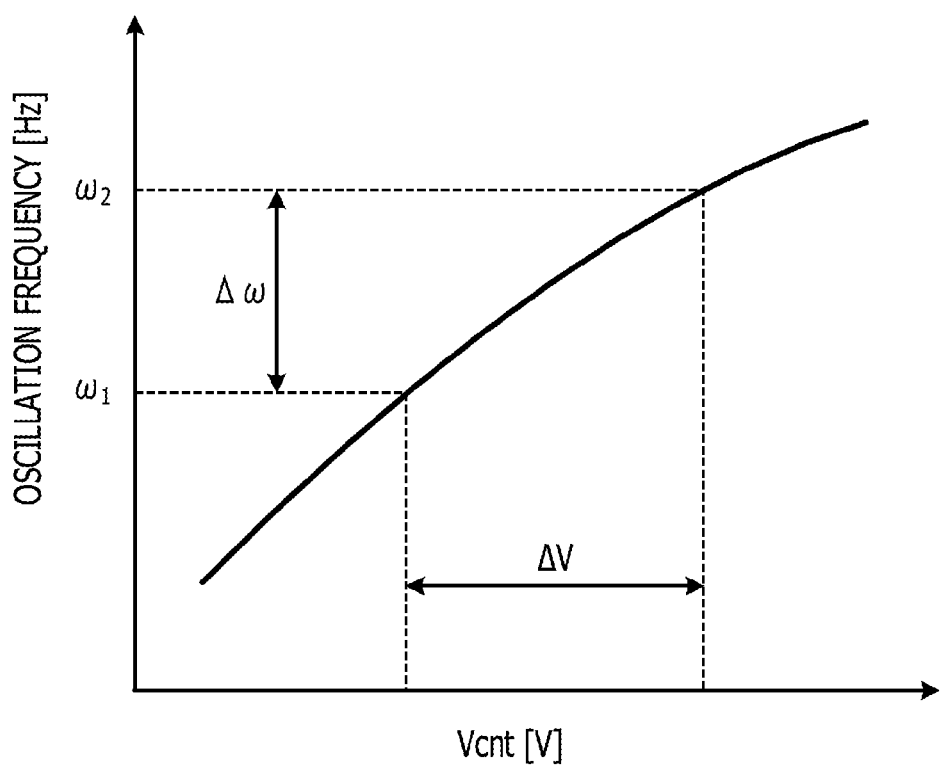
FIG. 5 illustrates an example characteristic curve of a quadrature oscillator according to a comparative example.

FIG. 4 illustrates an example configuration of a quadrature oscillator according to a comparative example for comparison with the first embodiment. FIG. 5 illustrates an example of a characteristic curve of a quadrature oscillator 211Aa illustrated in FIG. 4. The quadrature oscillator 211Aa in FIG. 4 is different from the quadrature oscillator 211A in FIG. 1 in that the quadrature oscillator 211Aa does not include the harmonic resonators 58, 59, 68, and 69.

As is apparent from the comparison between FIG. 3 and FIG. 5, in order to obtain the same oscillation frequency difference, that is, the same shift amount $\Delta\omega(=\omega_2-\omega_1)$, the quadrature oscillator 211A uses a lower drive voltage $\Delta V$ than the quadrature oscillator 211Aa. In other words, without an increase in the capacitance value of the capacitors 603 in the LC tanks 51 and 61, the quadrature oscillator has the wider the oscillation range with the relatively low control voltage Vcnt, resulting in the quadrature oscillator with suppressed Q value and extendable oscillation range. Furthermore, with the lower drive voltage $\Delta V$ for the same shift amount $\Delta\omega$, the drive circuit that generates the control voltage Vcnt consumes less power.

Now, the skipping (shifting) of the oscillation frequency ω depending on the magnitude of the control voltage Vcnt will be described with reference to FIGS. 6 to 11.

Figure 6:
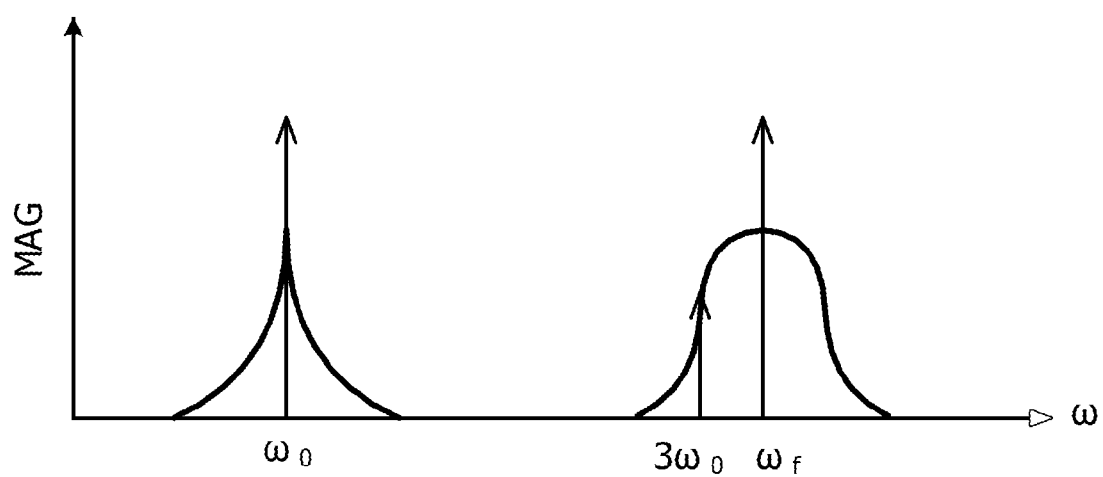
FIG. 6 illustrates an example of an oscillation spectrum of the quadrature oscillator according to the first embodiment.
Figure 7:
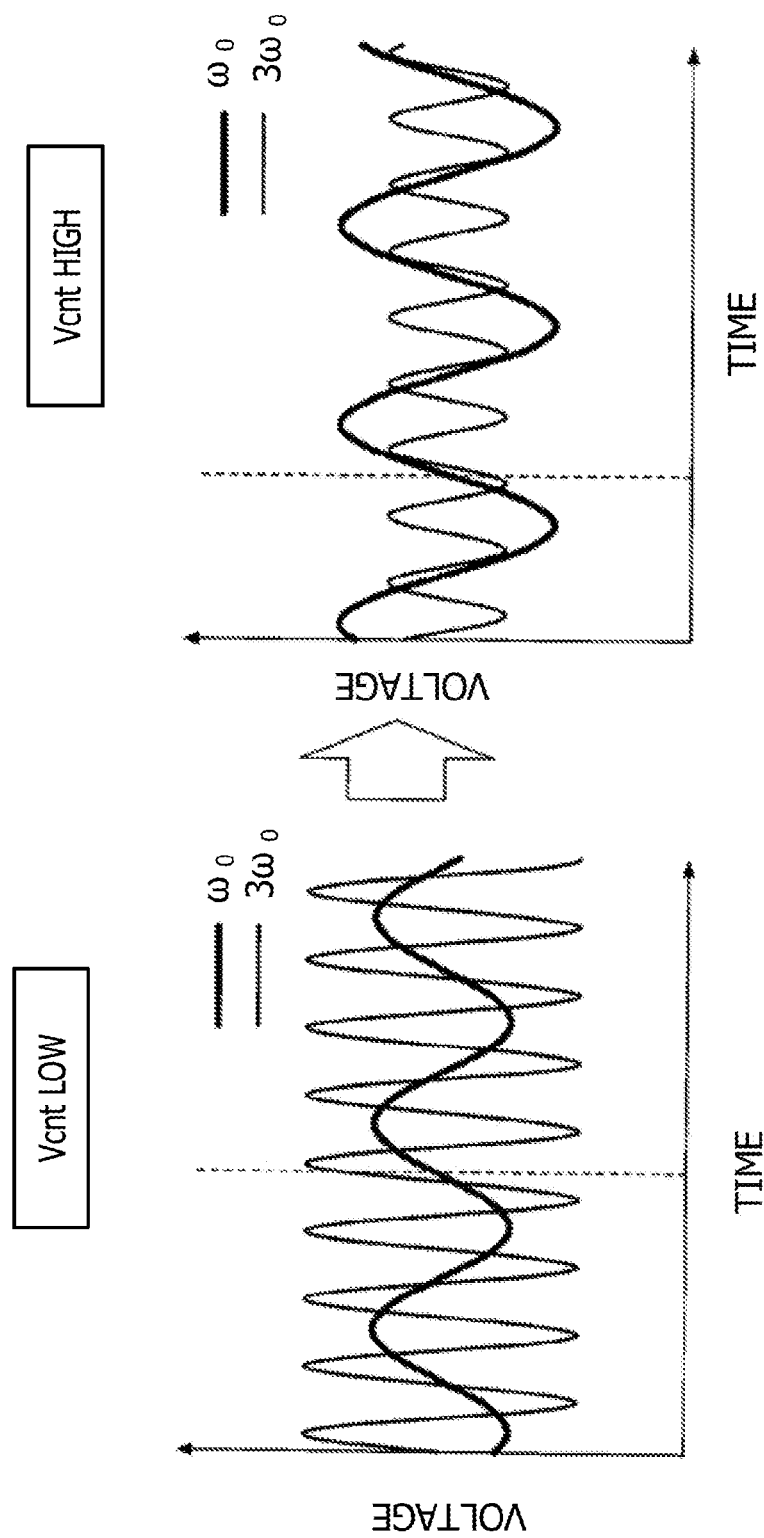
FIG. 7 illustrates a phase relationship between $\omega_0$ and $3\omega_0$ before and after a frequency skip.
Figure 8:
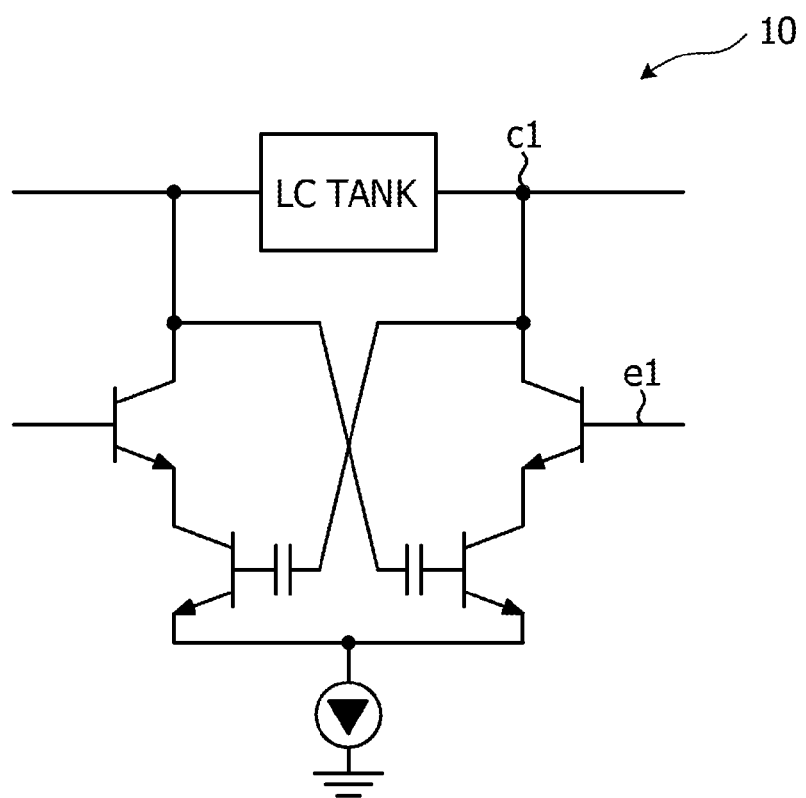
FIG. 8 illustrates an example configuration of a single voltage-controlled oscillator.
Figure 9:
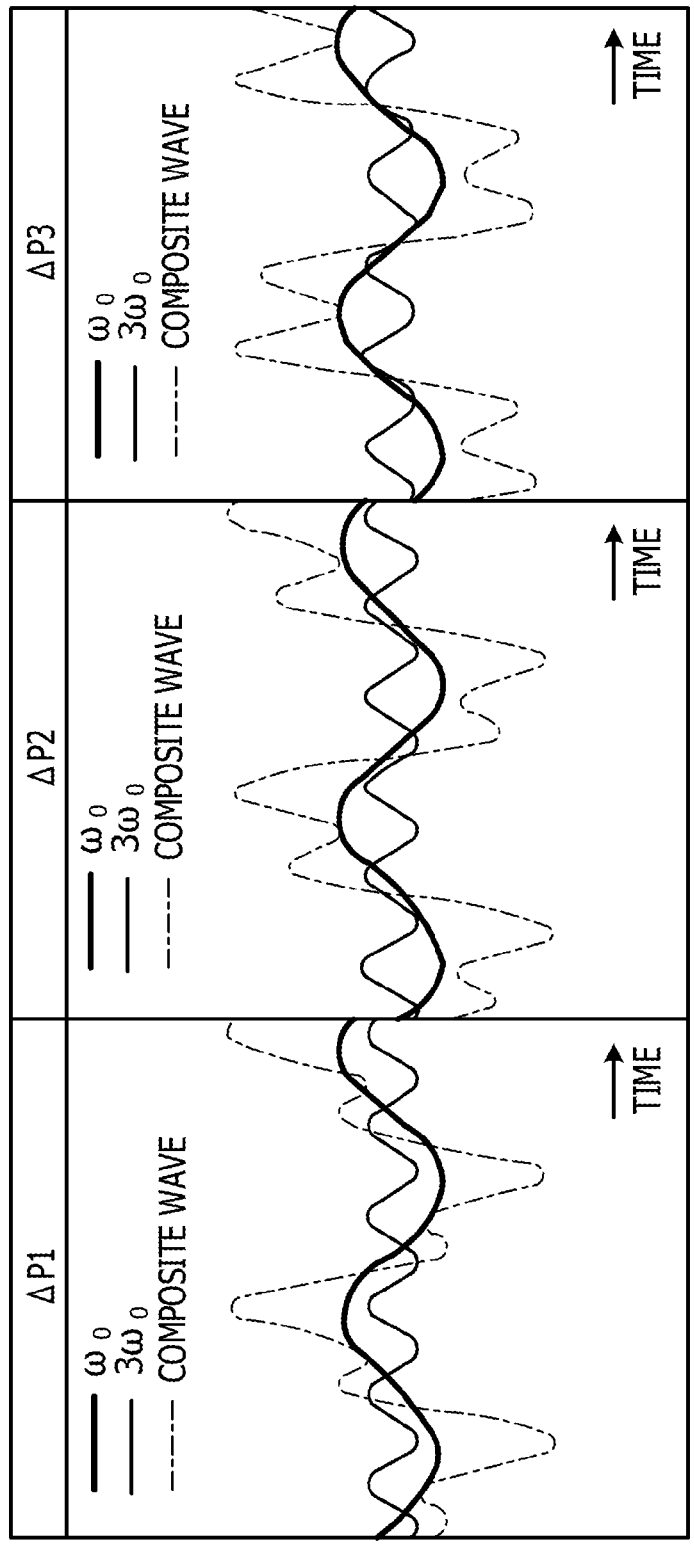
FIG. 9 illustrates a composite wave input to an injection transistor.
Figure 10:
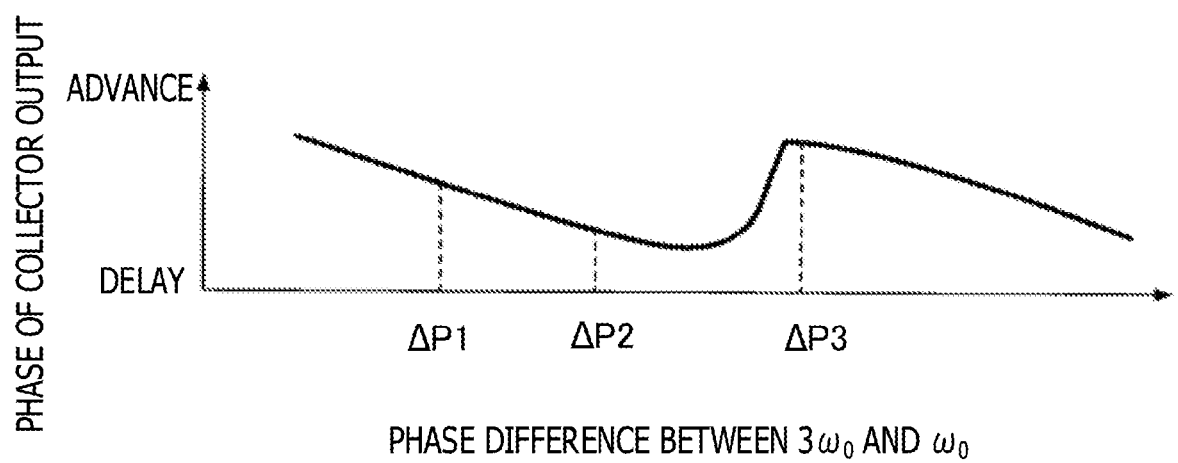
FIG. 10 illustrates a phase change in a collector output.
Figure 11:
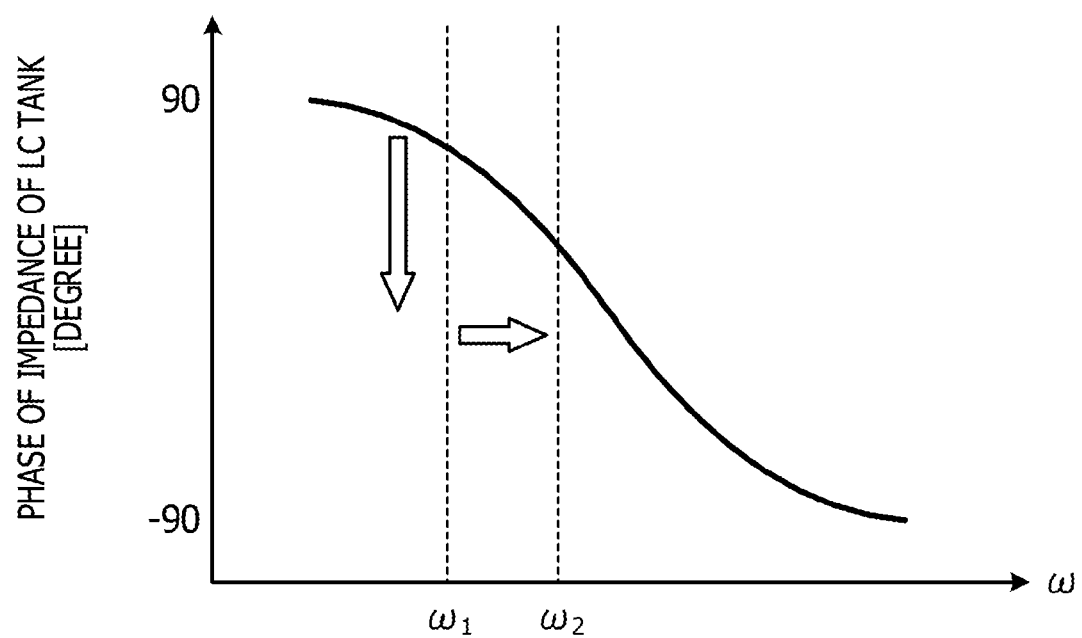
FIG. 11 illustrates a phase change in an impedance of an LC tank.

FIG. 6 illustrates an example of an oscillation spectrum of the quadrature oscillator according to the first embodiment. The horizontal axis represents the oscillation frequency ω of the quadrature oscillator and the vertical axis represents the amplitude MAG of the starting spectrum. With the harmonic resonators 58, 59, 68, and 69 disposed in the wiring, at the start of operation, the quadrature oscillator 211A oscillates at a fixed resonance frequency $\omega_f$ corresponding to the inductance component in the wiring. If the harmonic resonators 58, 59, 68, and 69 have a resonance frequency $3\omega_0$ three times the resonance frequency $\omega_0$ of the LC tanks 51 and 61, the resonance frequencies $\omega_0$ and $3\omega_0$ coexist in the quadrature oscillator 211A. As illustrated in FIG. 7, as the control voltage Vcnt is increased, the phase of the resonance frequency $3\omega_0$ delays with respect to the resonance frequency $\omega_0$, and when the phase difference exceeds a certain value, the oscillation frequency ω skips to a high value. On the other hand, in a single voltage-controlled oscillator 10 illustrated in FIG. 8, a composite wave (see FIG. 9) of the resonance frequencies $\omega_0$ and $3\omega_0$ is input to an input section e1 of the injection transistor, and when the phase difference exceeds a certain value, the phase of the collector output c1 rapidly advances (see FIG. 10). In FIG. 10, when the phase difference between the resonance frequency $\omega_0$ and the resonance frequency $3\omega_0$ increases from a phase difference $\Delta P1$ to a phase difference $\Delta P2$, the phase of the collector output c1 delays, and as the phase difference further increases to a phase difference $\Delta P3$, the phase rapidly skips in the advancing direction. Consequently, for a loop configuration like the quadrature oscillator 211A that has a combination of two single voltage-controlled oscillators 10, the phase is to be delayed. Accordingly, as illustrated in FIG. 11, the oscillation frequency ω is shifted (skipped) from an oscillation frequency $\omega_1$ on a low frequency side to an oscillation frequency $\omega_2$ on a high frequency side.

Figure 12:
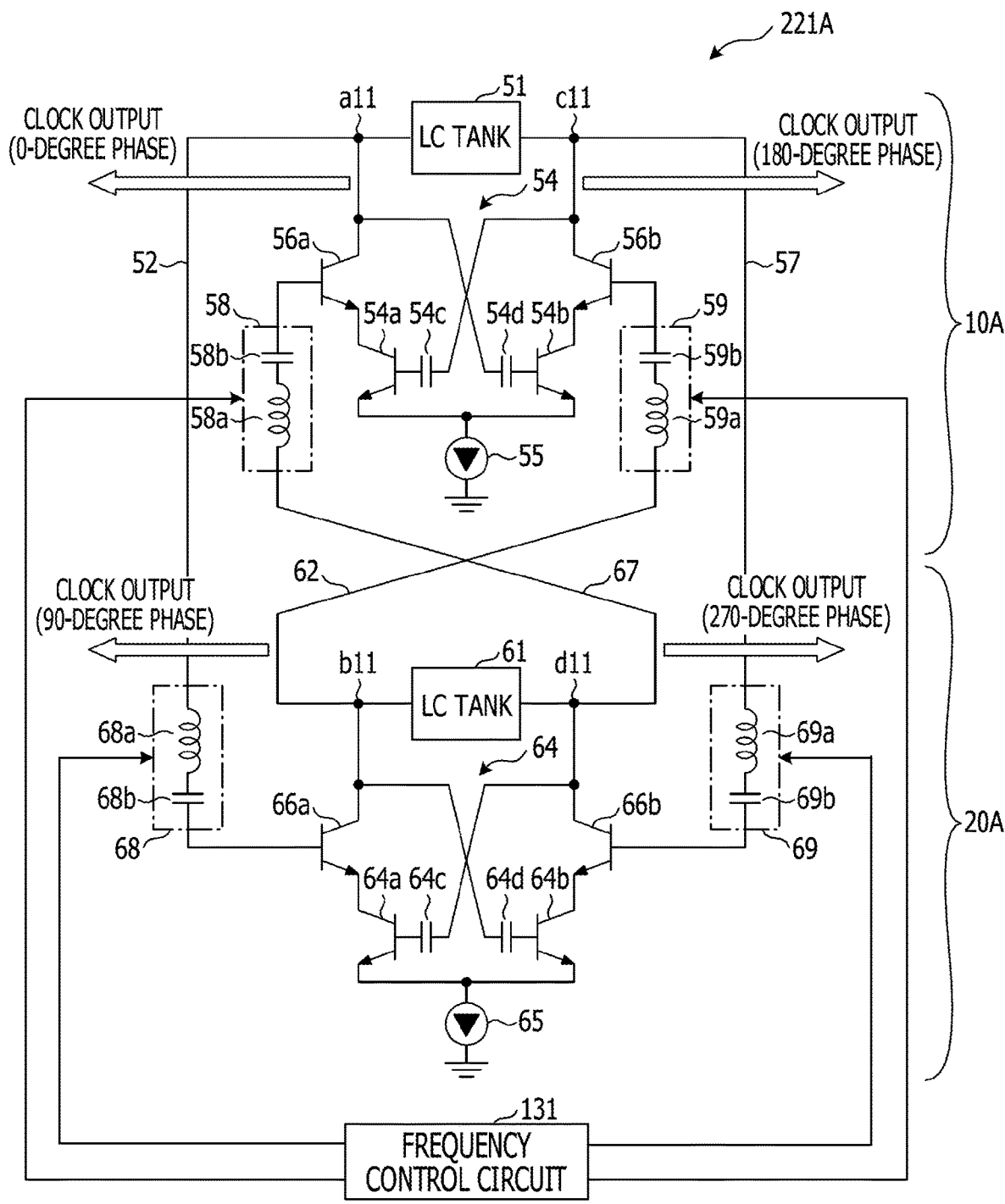
FIG. 12 illustrates an example configuration of a quadrature oscillator according to a second embodiment.
Figure 13:
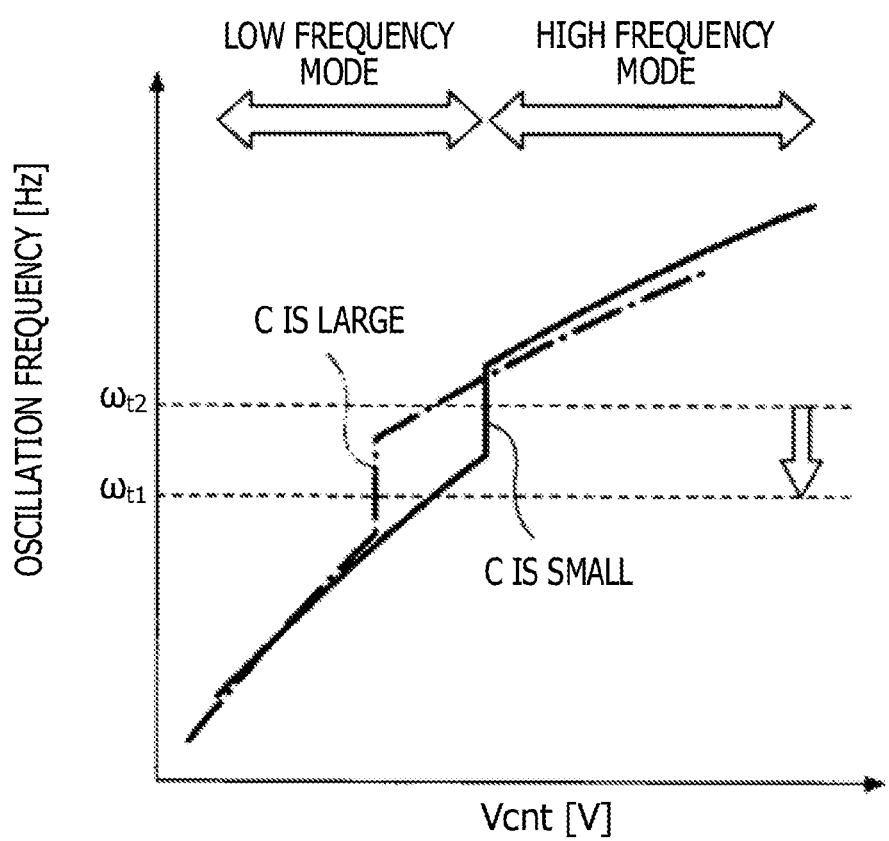
FIG. 13 illustrates an example of a characteristic curve of the quadrature oscillator according to the second embodiment.

FIG. 12 illustrates an example configuration of a quadrature oscillator according to a second embodiment. FIG. 13 illustrates an example of a characteristic curve of the quadrature oscillator according to the second embodiment. In the description of the second embodiment, descriptions of configurations and effects similar to those in the first embodiment are omitted by referring to the above description. A quadrature oscillator 221A in FIG. 12 is different from the quadrature oscillator 211A in FIG. 1 in that the quadrature oscillator 221A includes a frequency control circuit 131 that controls a resonance frequency (N×$\omega_0$) that is a resonance frequency of an odd multiple of the resonance frequency of the harmonic resonators 58, 59, 68, and 69. Controlling the resonant frequency (N×$\omega_0$) enables adjustment of a transition frequency $\omega_t$ between two characteristic curves as illustrated in FIG. 13. By the control, the frequency range in which the oscillation frequency ω skips is changed by so as to meet required specifications.

The frequency control circuit 131 illustrated in FIG. 12 controls the resonance frequency (N×$\omega_0$) by changing each capacitance C of the capacitors 58b, 59b, 68b, and 69b in the harmonic resonators 58, 59, 68, and 69 respectively. For example, when the capacitors 58b, 59b, 68b, and 69b are variable capacitors such as varactors, the frequency control circuit 131 changes a voltage to be applied to the variable capacitors to change the capacitance C. For example, as illustrated in FIG. 13, the frequency control circuit 131 increases the capacitance C of the capacitors 58b, 59b, 68b, and 69b to change the transition frequency $\omega_t$ from a frequency $\omega_{t2}$ on a high frequency side to a frequency $\omega_{t1}$ on a low frequency side.

The function of the frequency control circuit 131 may be implemented by a logic circuit or may be implemented by causing a central processing unit (CPU) to operate by a program readably stored in a memory.

Figure 14:
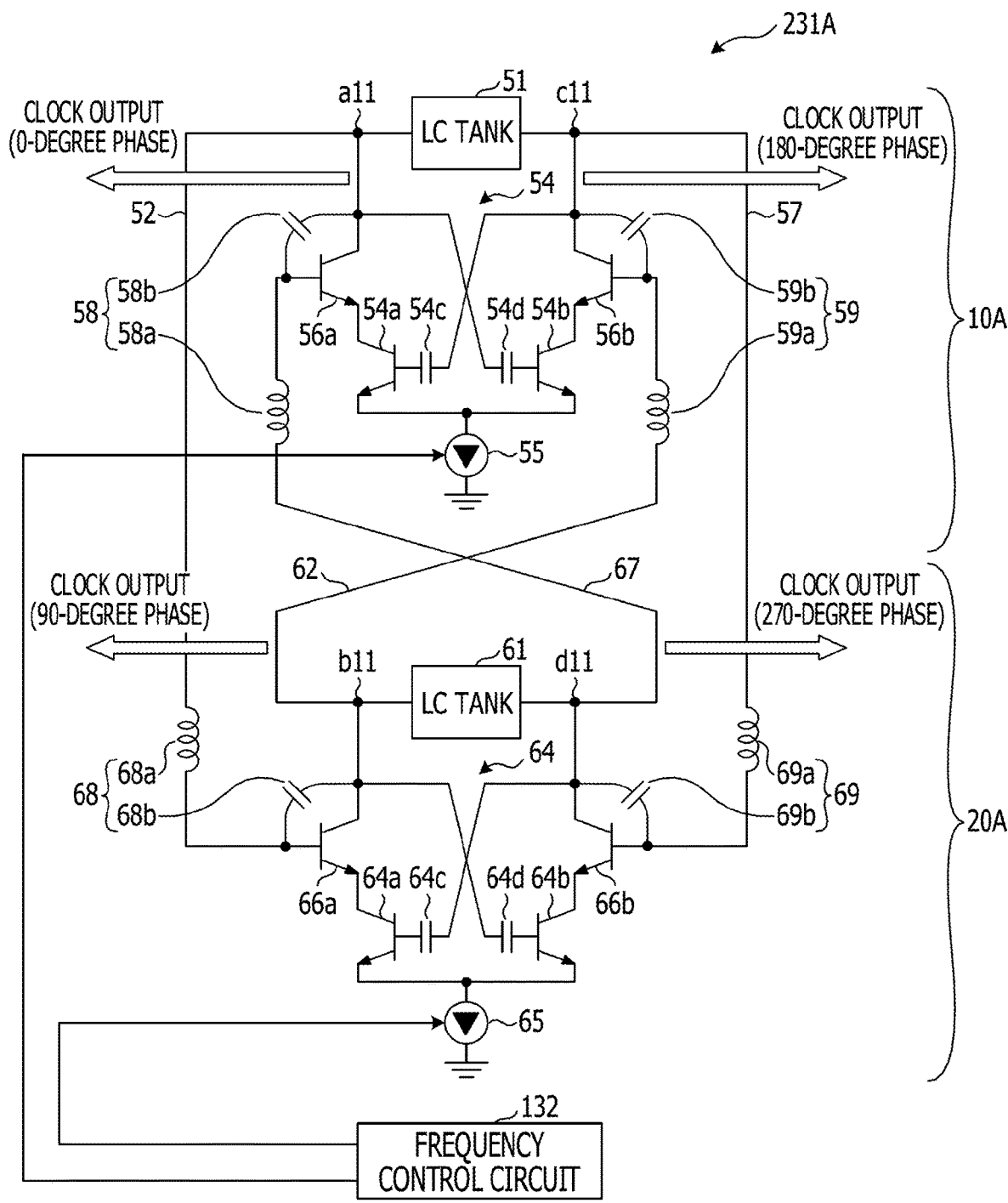
FIG. 14 illustrates an example configuration of a quadrature oscillator according to a third embodiment.
Figure 15:
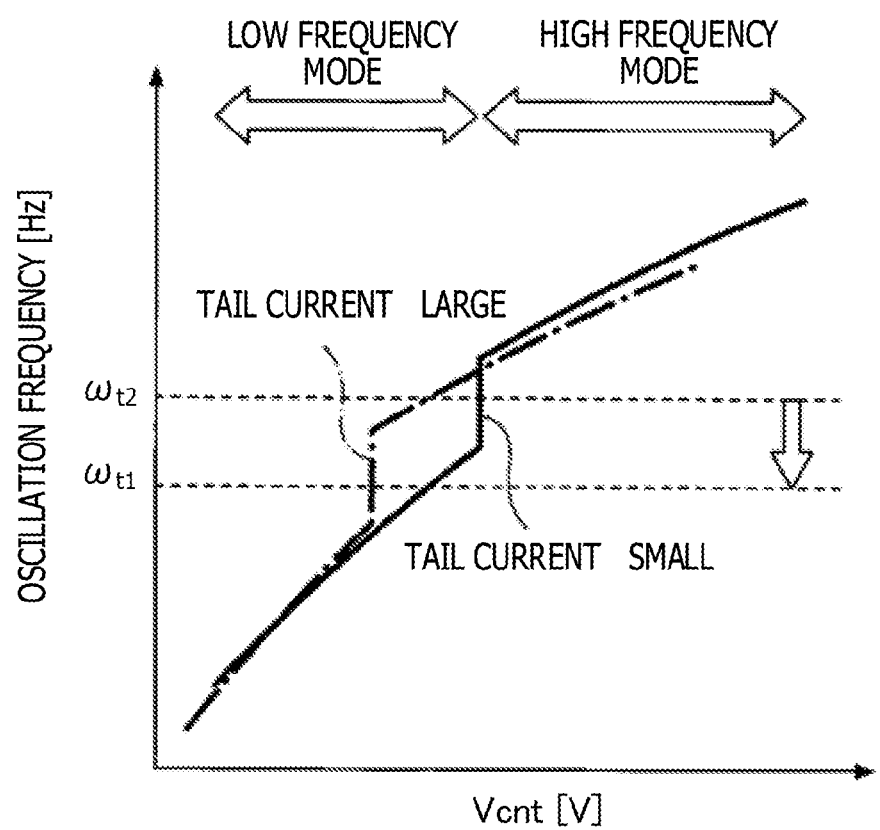
FIG. 15 illustrates an example of a characteristic curve of the quadrature oscillator according to the third embodiment.

FIG. 14 illustrates an example configuration of a quadrature oscillator according to a third embodiment. FIG. 15 illustrates an example of a characteristic curve of the quadrature oscillator according to the third embodiment. In the description of the third embodiment, descriptions of configurations and effects similar to those in the above-described embodiments are omitted by referring to the above description. A quadrature oscillator 231A illustrated in FIG. 14 is different from the quadrature oscillator 221A in FIG. 12 in that each of the capacitors 58b, 59b, 68b, and 69b in the harmonic resonators 58, 59, 68, and 69 is capacitance between the base and the collector of each of the transistors 56a, 56b, 66a, and 66b. A frequency control circuit 132 in FIG. 14 changes a value of a tail current supplied from a tail current source 55 and a value of a tail current supplied from a tail current source 65 to control the resonance frequency (N×$\omega_0$) that is a resonance frequency of an odd multiple of the resonance frequency of the harmonic resonators 58, 59, 68, and 69. The change in the values of the tail currents changes the capacitance between the base and the collector of each of the transistors 56a, 56b, 66a, and 66b. Accordingly, for example, as illustrated in FIG. 15, the frequency control circuit 132 increases the values of the tail currents of the tail current sources 55 and 65 to change the transition frequency $\omega_t$ from a frequency $\omega_{t2}$ on a high frequency side to a frequency $\omega_{t1}$ on a low frequency side.

The function of the frequency control circuit 132 may be implemented by a logic circuit or may be implemented by causing a CPU to operate by a program readably stored in a memory.

Figure 16:
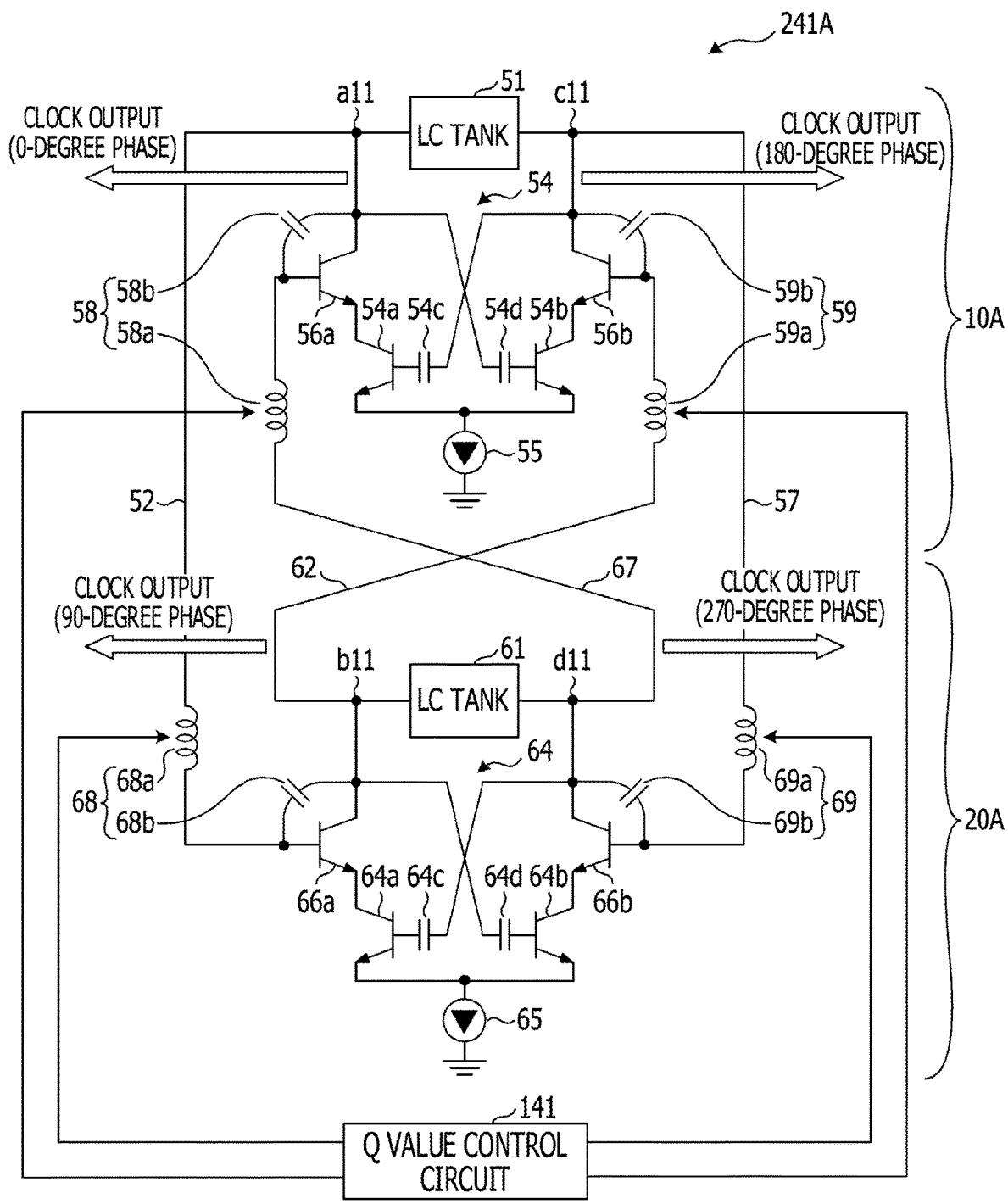
FIG. 16 illustrates an example configuration of a quadrature oscillator according to a fourth embodiment.
Figure 17:
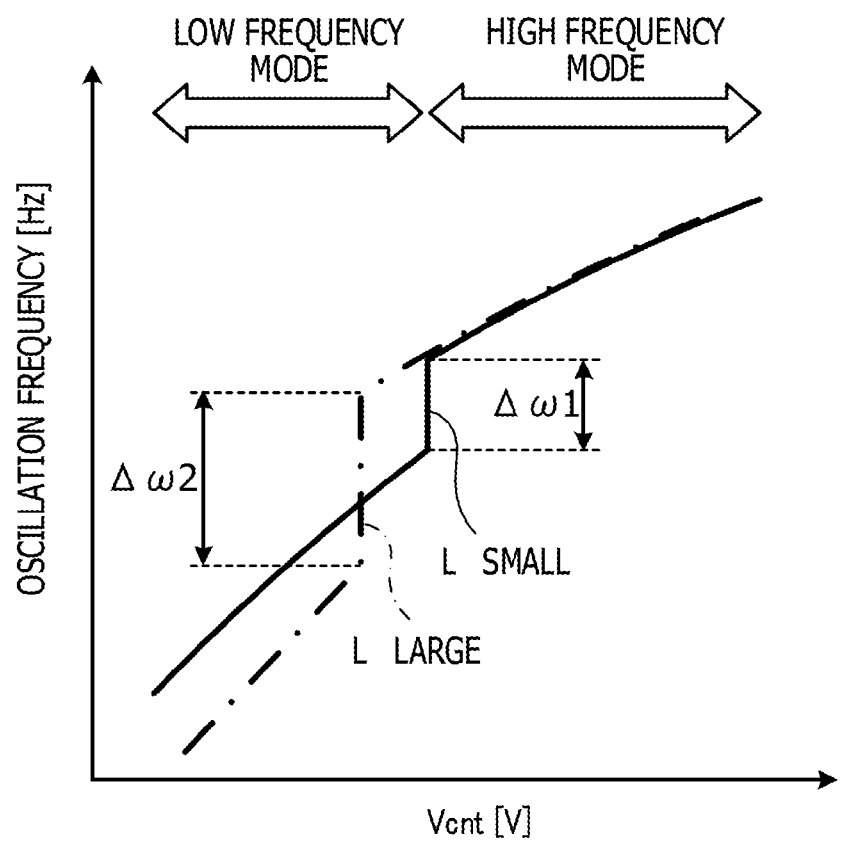
FIG. 17 illustrates an example of a characteristic curve of the quadrature oscillator according to the fourth embodiment.

FIG. 16 illustrates an example configuration of a quadrature oscillator according to a fourth embodiment. FIG. 17 illustrates an example of a characteristic curve of the quadrature oscillator according to the fourth embodiment. In the description of the fourth embodiment, descriptions of configurations and effects similar to those in the above-described embodiments are omitted by referring to the above description. A quadrature oscillator 241A in FIG. 16 is different from the quadrature oscillator 231A in FIG. 14 in that the quadrature oscillator 241A includes a Q-value control circuit 141 that controls Q values of the harmonic resonators 58, 59, 68, and 69. Controlling the Q values enables adjustment of the shift amount Δω of the oscillation frequency ω as illustrated in FIG. 17. By the control, the shift amount Δω is changed so as to meet required specifications.

The Q-value control circuit 141 illustrated in FIG. 16 controls the inductance L of the inductors 58a, 59a, 68a, and 69a in the harmonic resonators 58, 59, 68, and 69 to control the shift amount Δω. For example, when the inductance L of the inductors 58a, 59a, 68a, and 69a can be changed by an inductance variable circuit such as a transformer, the Q-value control circuit 141 controls the inductance variable circuit to change the inductance L. For example, as illustrated in FIG. 17, the Q-value control circuit 141 increases the inductance L of the inductors 58a, 59a, 68a, and 69a to change the shift amount Δω from Δω1 to Δω2.

The function of the Q-value control circuit 141 may be implemented by a logic circuit or may be implemented by causing a CPU to operate by a program readably stored in a memory.

FIG. 18 illustrates an example inductance variable circuit. The Q-value control circuit 141 changes the inductance L of the inductors 58a, 59a, 68a, and 69a by a transformer. The transformer includes, for example, at least two coils L1 and L2 which are laminated. The coil L1 corresponds to the inductors 58a, 59a, 68a, and 69a. The Q-value control circuit 141 passes a current through the coil L2 to change the inductance L of the coil L1.

Figure 19:
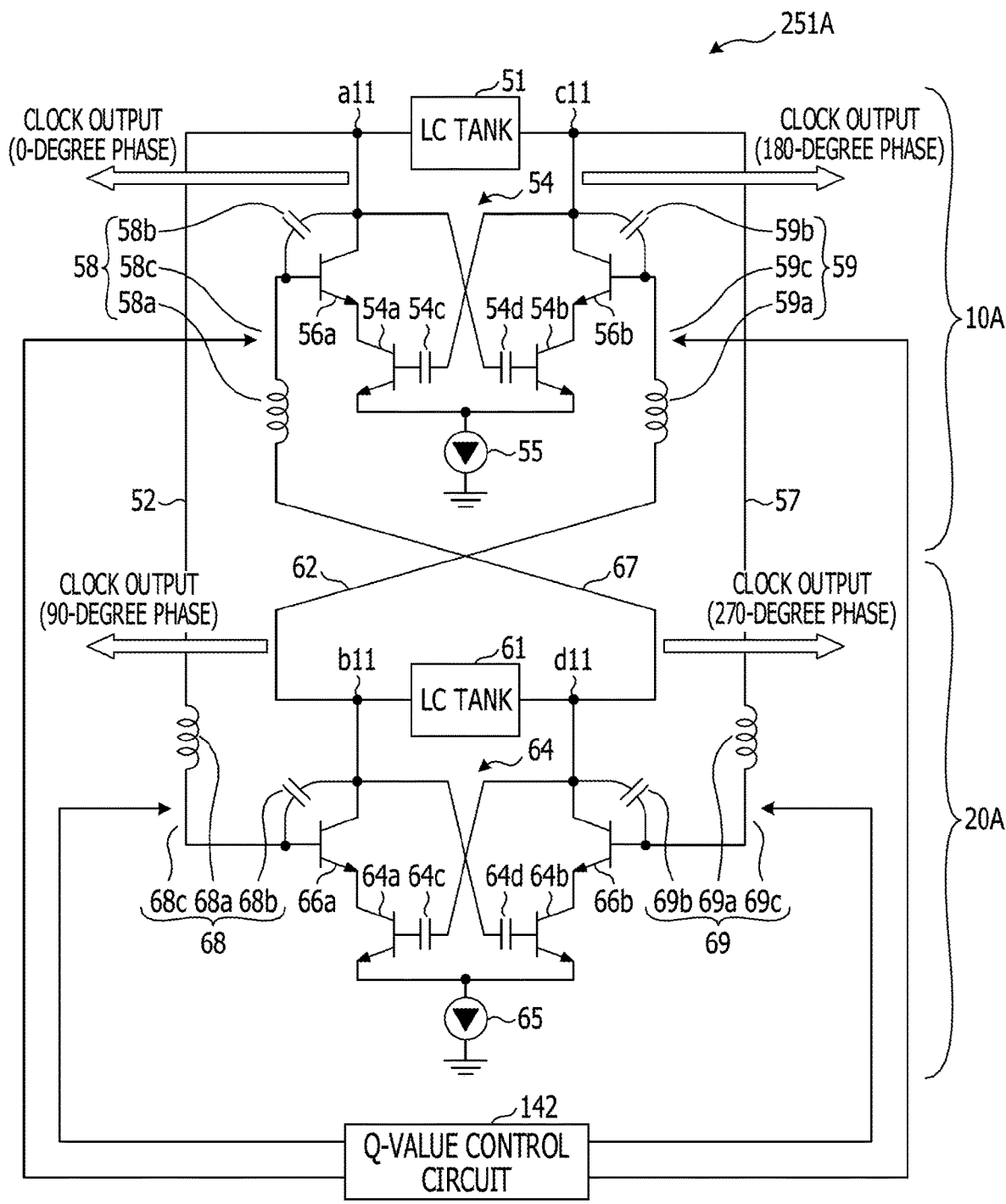
FIG. 19 illustrates an example configuration of a quadrature oscillator according to a fifth embodiment.
Figure 20:
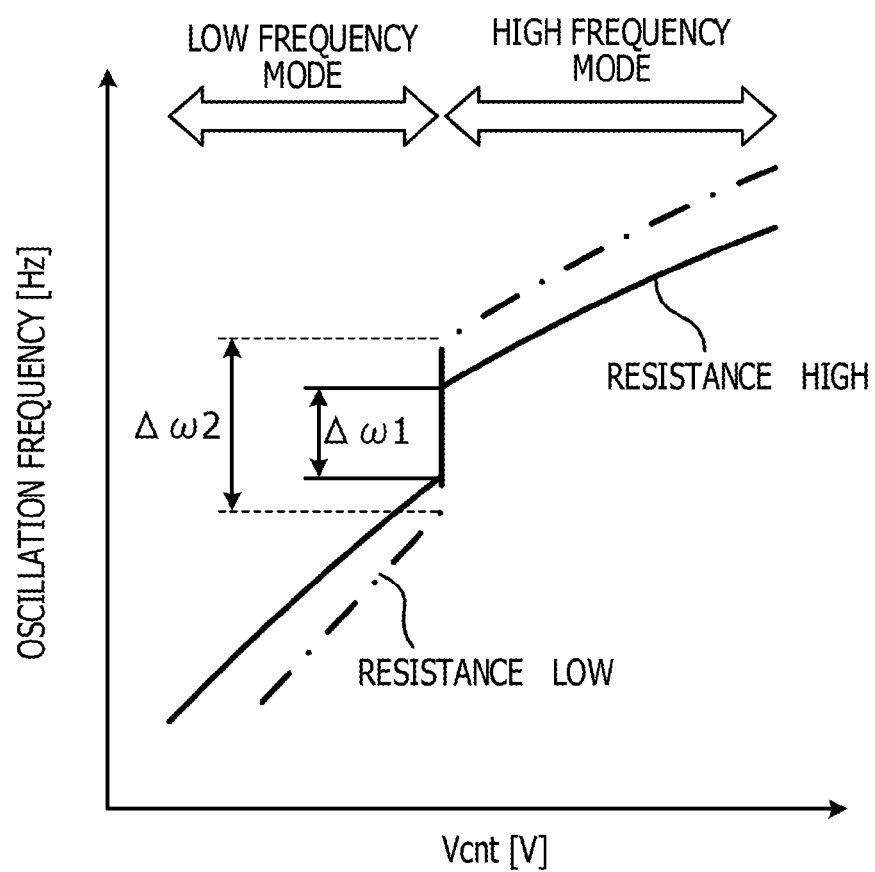
FIG. 20 illustrates an example of a characteristic curve of the quadrature oscillator according to the fifth embodiment.

FIG. 19 illustrates an example configuration of a quadrature oscillator according to a fifth embodiment. FIG. 20 illustrates an example of a characteristic curve of the quadrature oscillator according to the fifth embodiment. In the description of the fifth embodiment, descriptions of configurations and effects similar to those in the above-described embodiments are omitted by referring to the above description. A quadrature oscillator 251A in FIG. 19 is different from the quadrature oscillator 241A in FIG. 16 in that the harmonic resonators 58, 59, 68, and 69 have resistors 58c, 59c, 68c, and 69c respectively. The resistors 58c, 59c, 68c, and 69c are inserted in series in corresponding lines and connected in series to the inductors and the capacitors in the harmonic resonators respectively. A Q-value control circuit 142 illustrated in FIG. 19 changes the resistance values of the resistors 58c, 59c, 68c, and 69c to control the Q values of the harmonic resonators 58, 59, 68, and 69. For example, as illustrated in FIG. 20, the Q-value control circuit 142 decreases the resistance values of the resistors 58c, 59c, 68c, and 69c to increase the shift amount Δω from Δω1 to Δω2.

The function of the Q-value control circuit 142 may be implemented by a logic circuit or may be implemented by causing a CPU to operate by a program readably stored in a memory.

Figure 21:
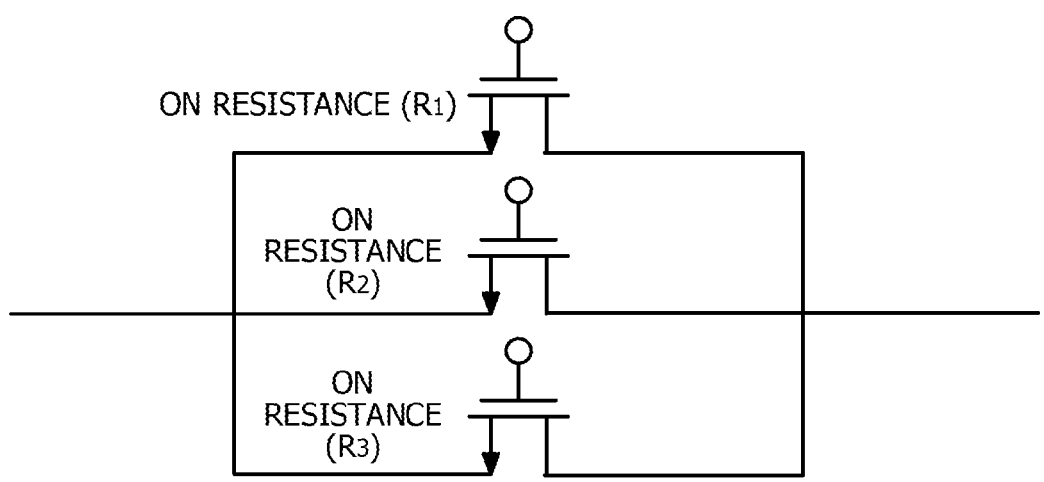
FIG. 21 illustrates example variable resistors.
Figure 22:
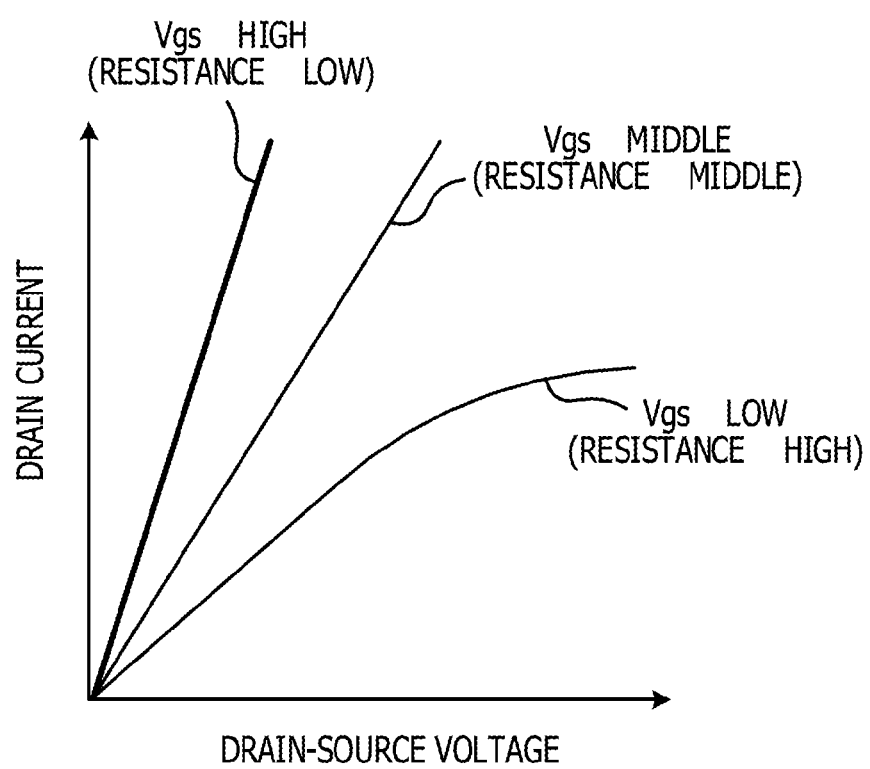
FIG. 22 illustrates example characteristic curves of variable resistors.

As illustrated in FIG. 21, the resistors 58c, 59c, 68c, and 69c may be variable resistance elements such as MOSFETs. FIG. 21 illustrates 3-bit variable resistance elements, and when all three MOSFETs are turned on, the resistance value becomes a lowest resistance value. The Q-value control circuit 142 adjusts a voltage Vgs between the gate and the source to operate the MOSFETs in a linear region (see FIG. 22) to change the resistance values of the resistors 58c, 59c, 68c, and 69c.

Figure 23:
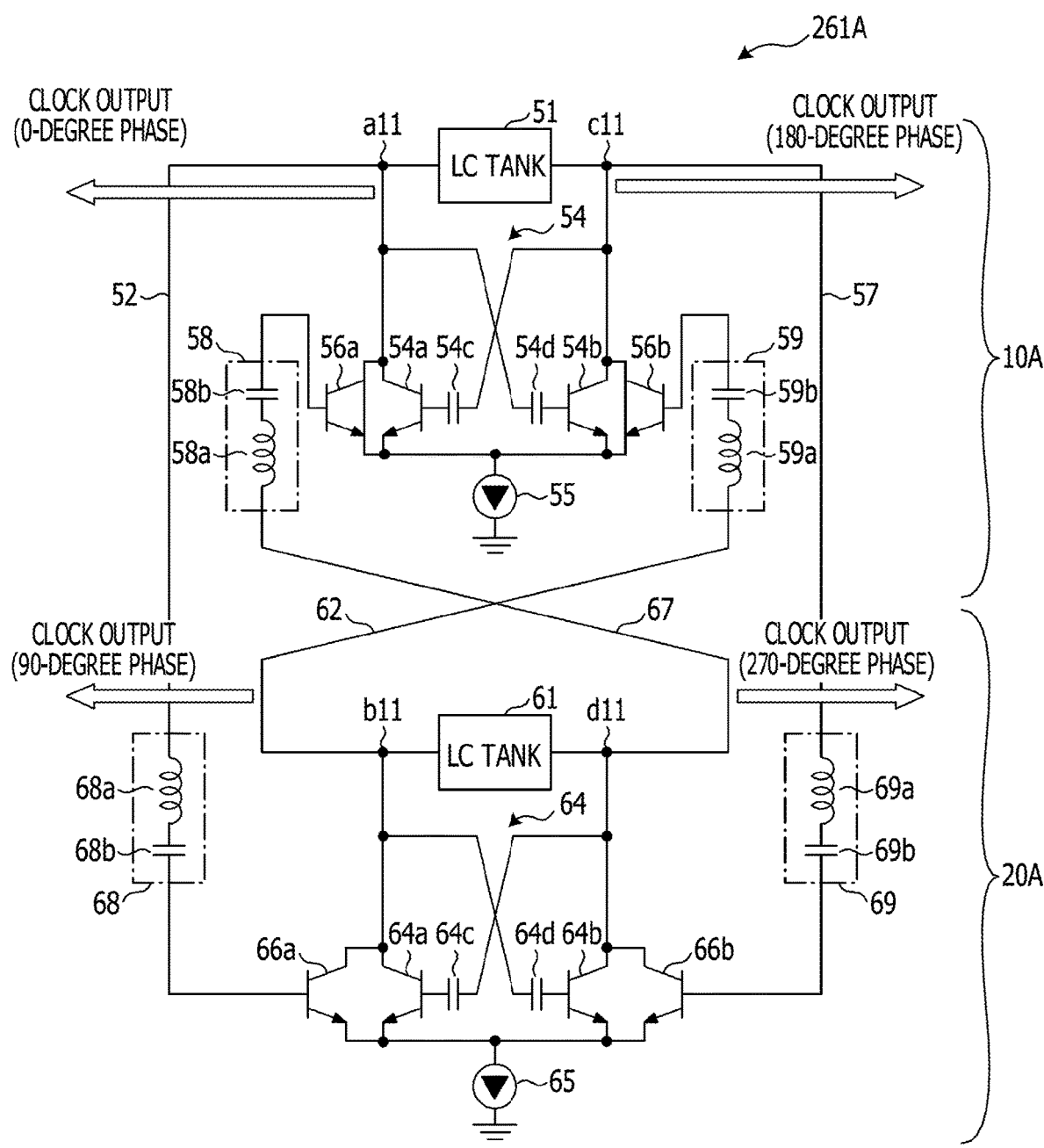
FIG. 23 illustrates an example configuration of a quadrature oscillator according to a sixth embodiment.

FIG. 23 illustrates an example configuration of a quadrature oscillator according to a sixth embodiment. In the description of the sixth embodiment, descriptions of configurations and effects similar to those in the above-described embodiments are omitted by referring to the above description. A quadrature oscillator 261A in FIG. 23 is different from the quadrature oscillator 211A in FIG. 1 in that the injection transistors 56a, 56b, 66a, and 66b are connected to the transistors 54a, 54b, 64a, and 64b in parallel. Similarly to the configuration in FIG. 1, the configuration in FIG. 23 can suppress the reduction in Q value and extend the oscillation range.

Figure 24:
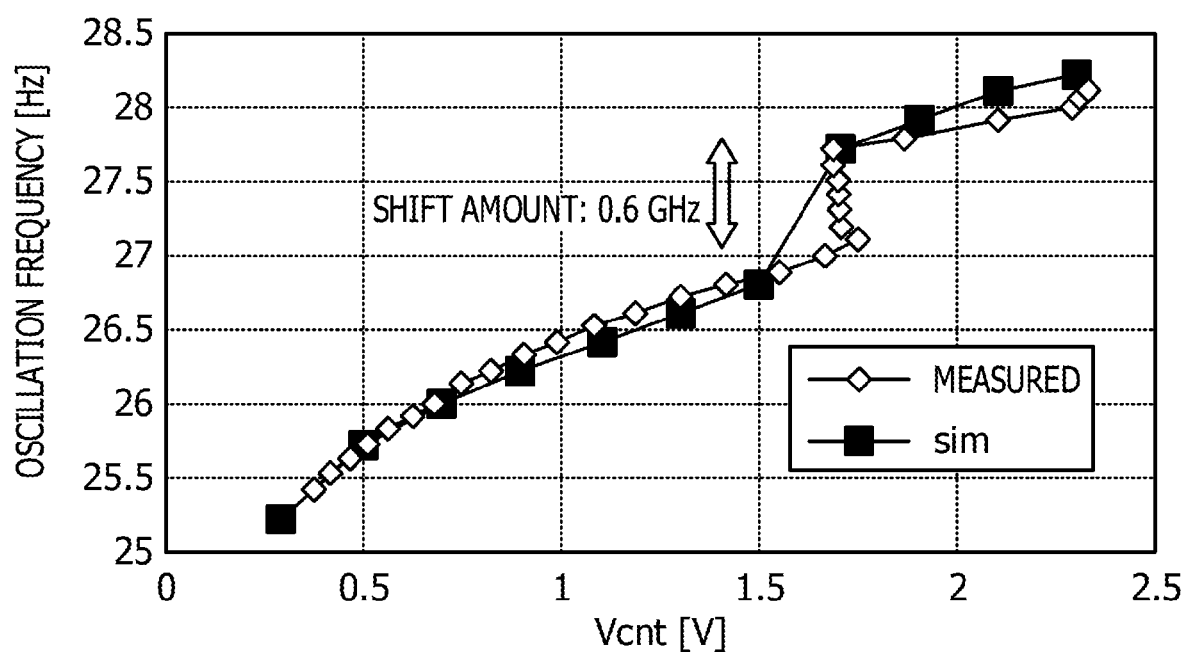
FIG. 24 illustrates a difference in characteristic curves between simulation calculation and actual measurement of a quadrature oscillator according to the sixth embodiment.
Figure 25:
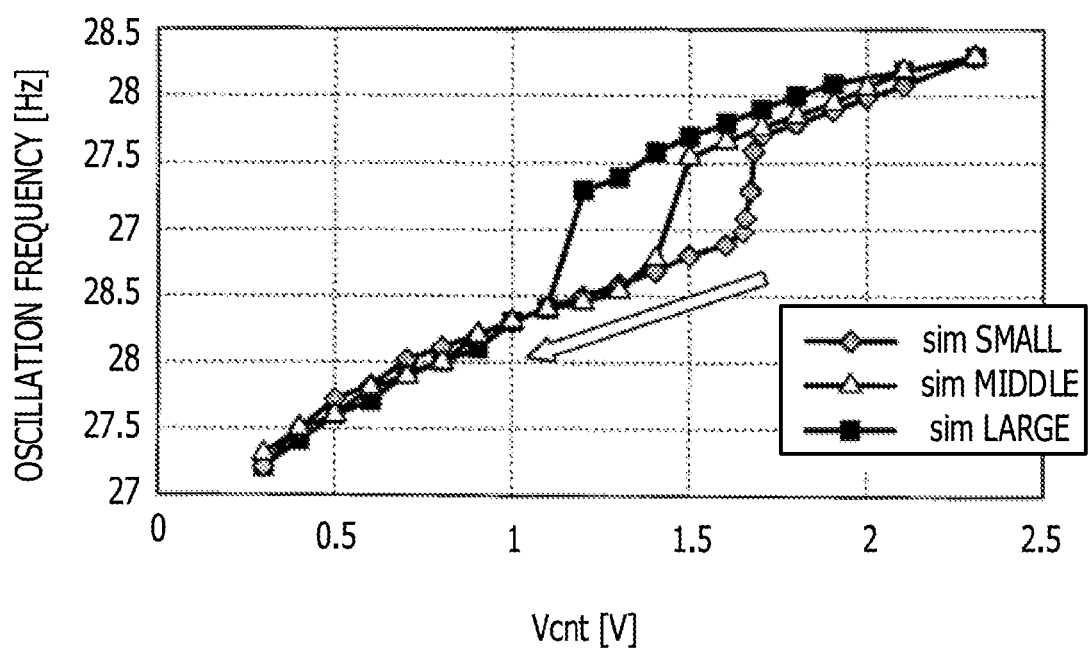
FIG. 25 illustrates a difference in characteristic curves due to a change in a tail current value in the quadrature oscillator according to the third embodiment.

FIG. 24 illustrates a difference in characteristic curves between simulation calculation and actual measurement of the quadrature oscillator according to the sixth embodiment. A shift amount Δω of about 0.6 GHz was obtained both in the simulation calculation with a computer (legend: sim) and the actual measurement with a prototype (legend: measured). FIG. 25 illustrates a difference in characteristic curves due to a change in the tail current value in the quadrature oscillator 231A (see FIG. 14) according to the third embodiment. In the simulation calculation with a computer, as the tail current value increased, the transition frequency $\omega_t$ decreased.

Figure 26:
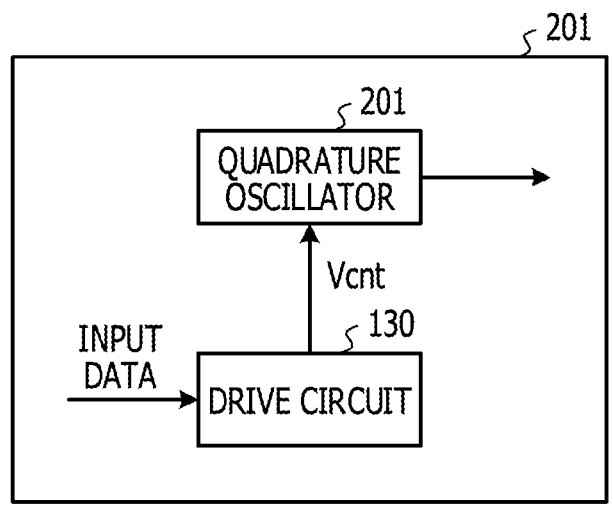
FIG. 26 illustrates an example configuration of an FSK modulator according to a first embodiment.

FIG. 26 illustrates an example configuration of an FSK modulator according to a first embodiment. A FSK modulator 201 is a circuit that changes the frequency of a carrier wave in accordance with input data. The FSK modulator 201 includes a quadrature oscillator 200 and a drive circuit 130. The quadrature oscillator 200 corresponds to one quadrature oscillator according to the first embodiment. The drive circuit 130 outputs a control voltage Vcnt for changing the capacitance of the capacitors 603 in the LC tanks 51 and 61 such that the frequencies of a four-phase clock output from the quadrature oscillator 2200 is changed in accordance with input data.

Figure 27:
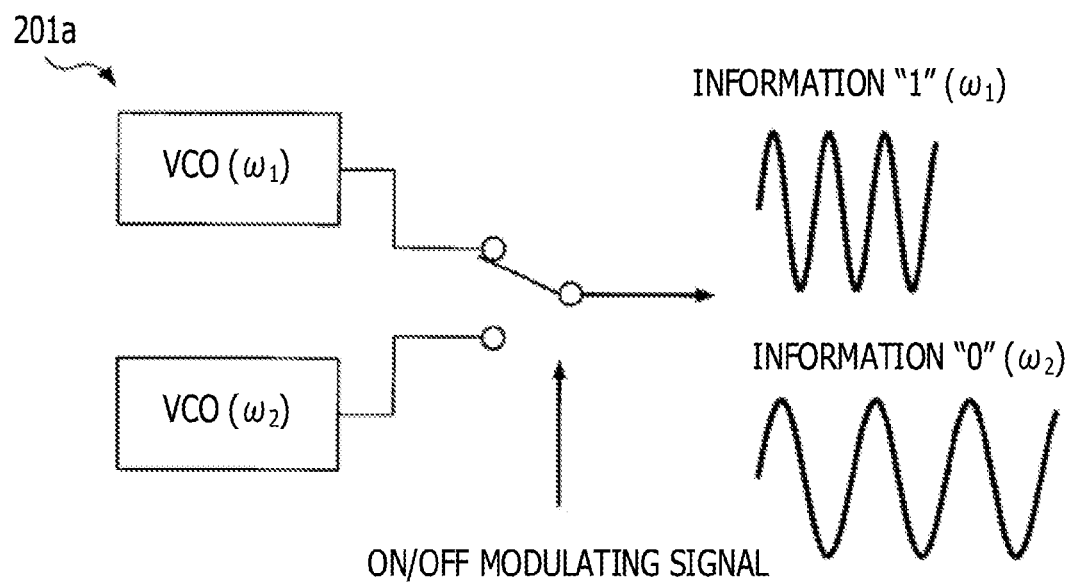
FIG. 27 illustrates an example configuration of a quadrature oscillator according to a comparative example.

FIG. 27 illustrates an example configuration of an FSK modulator according to a comparative example for comparison with the first embodiment. An FSK modulator 201a in FIG. 27 switches two voltage-controlled oscillators VCO that have different oscillation frequencies in accordance with a digital modulating signal. That is, the configuration in FIG. 27 requires the two voltage-controlled oscillators VCO that have different oscillation frequencies. On the other hand, the FSK modulator 201 in FIG. 26 changes the control voltage Vcnt by using the drive circuit 130 such that the oscillation frequency ω skips to generate a plurality of oscillation frequencies ω in the single quadrature oscillator 200, enabling miniaturization of the FSK modulator.

Figure 28:
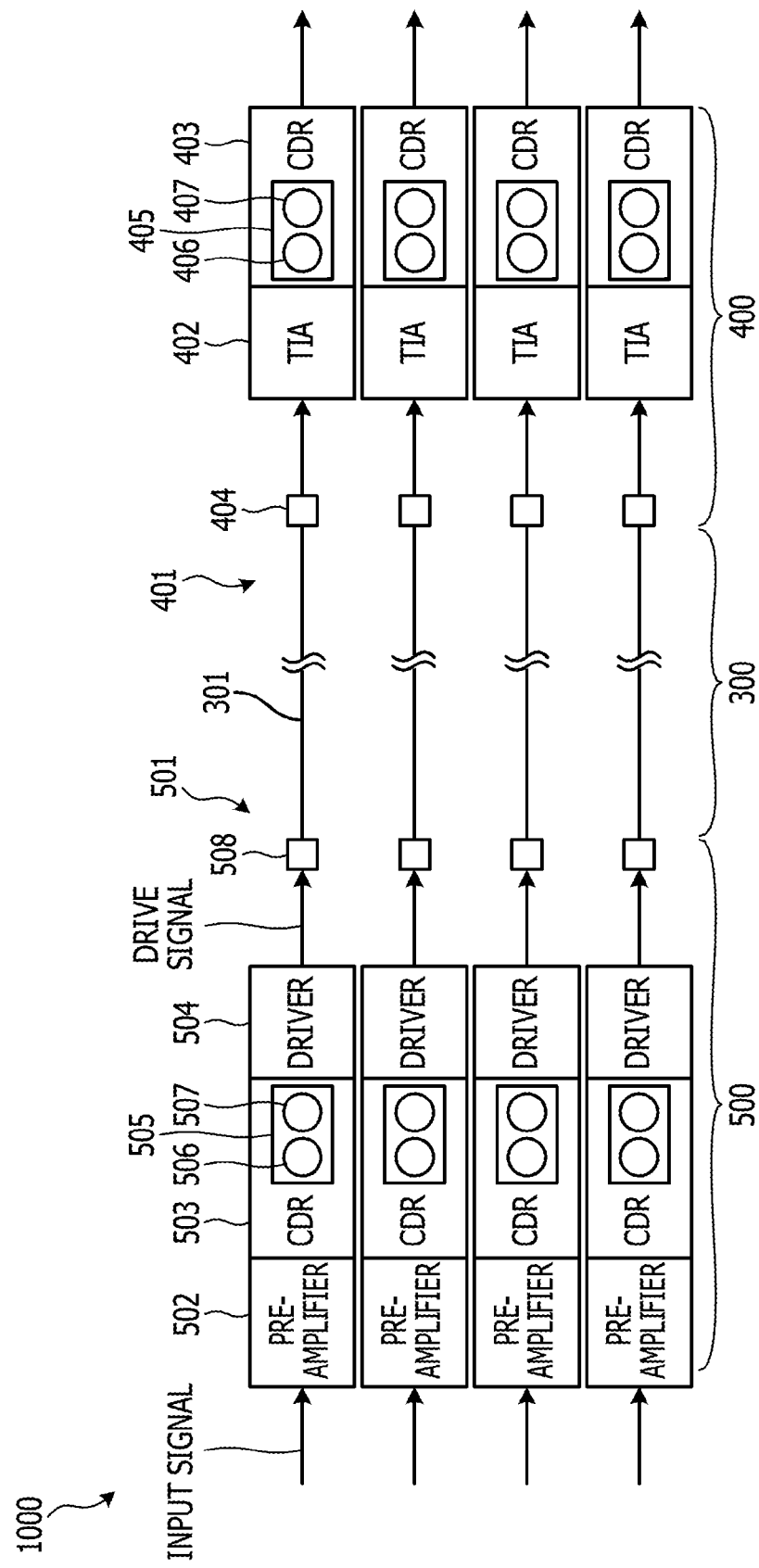
FIG. 28 illustrates an example configuration of an optical module according to a first embodiment.

FIG. 28 illustrates an example configuration of an optical module according to a first embodiment. An optical module according to the first embodiment may be an optical communication system 1000, a send circuit 500, or a receive circuit 400.

The optical communication system 1000 includes the send circuit 500 that converts an input signal into an output signal and outputs the signal, an optical fiber 300 that transmits the optical signal from the send circuit 500, and the receive circuit 400 that receives the optical signal and recovers the received signal. The send circuit 500 recovers an input signal sent from an electronic device or other devices and generates an optical signal. The send circuit 500 may be a relaying device that receives an optical signal via the optical fiber 300, converts the optical signal into an electrical signal, converts the electrical signal back into an optical signal, and outputs the signal. The receive circuit 400 outputs a recovered received signal to an electronic device or other devices as an electrical signal. The receive circuit 400 may be a relaying device that converts a received signal back into an optical signal and outputs the signal.

The send circuit 500 includes a plurality of send sections 501. Each send section 501 includes a preamplifier 502, a CDR section 503, a driver 504, and a light emitting element 508. The CDR section 503 recovers a clock from a data signal, which is an input signal amplified by the preamplifier 502, with a four-phase clock generated by a quadrature oscillator 505 and recovers the transmitted data signal. The CDR section 503 includes the quadrature oscillator 505 that includes an I-phase coil 506 and a Q-phase coil 507 to be used for four-phase clock generation. The driver 504 outputs a drive signal for driving the light emitting element 508 in accordance with a transmitted data signal, generates an optical signal by using the light emitting element 508, and outputs the optical signal to a fiber line 301 of the optical fiber 300. Specific examples of the light emitting element 508 include a laser diode.

The optical fiber 300 includes a plurality of fiber lines 301. Each of the respective fiber lines 301 connects between the send section 501 and the receive section 401.

The receive circuit 400 includes a plurality of receive sections 401. Each receive section 401 includes a photoreceptor 404, a transimpedance amplifier (TIA) 402, and a CDR section 403. The photoreceptor 404 converts an optical signal received via the fiber line 301 of the optical fiber 300 into an electrical received data signal. Specific examples of the photoreceptor 404 include a photodiode. The TIA 402 amplifies a received data signal. The CDR section 403 recovers a clock and a received data signal from a received data signal with a four-phase clock generated by a quadrature oscillator 405. The CDR section 403 includes the quadrature oscillator 405 that includes an I-phase coil 406 and a Q-phase coil 407 to be used for four-phase clock generation.

The quadrature oscillation circuit according to the first embodiment may be applied to the quadrature oscillator 505 in the send circuit 500 and the quadrature oscillator 405 in the receive circuit 400.

Figure 29:
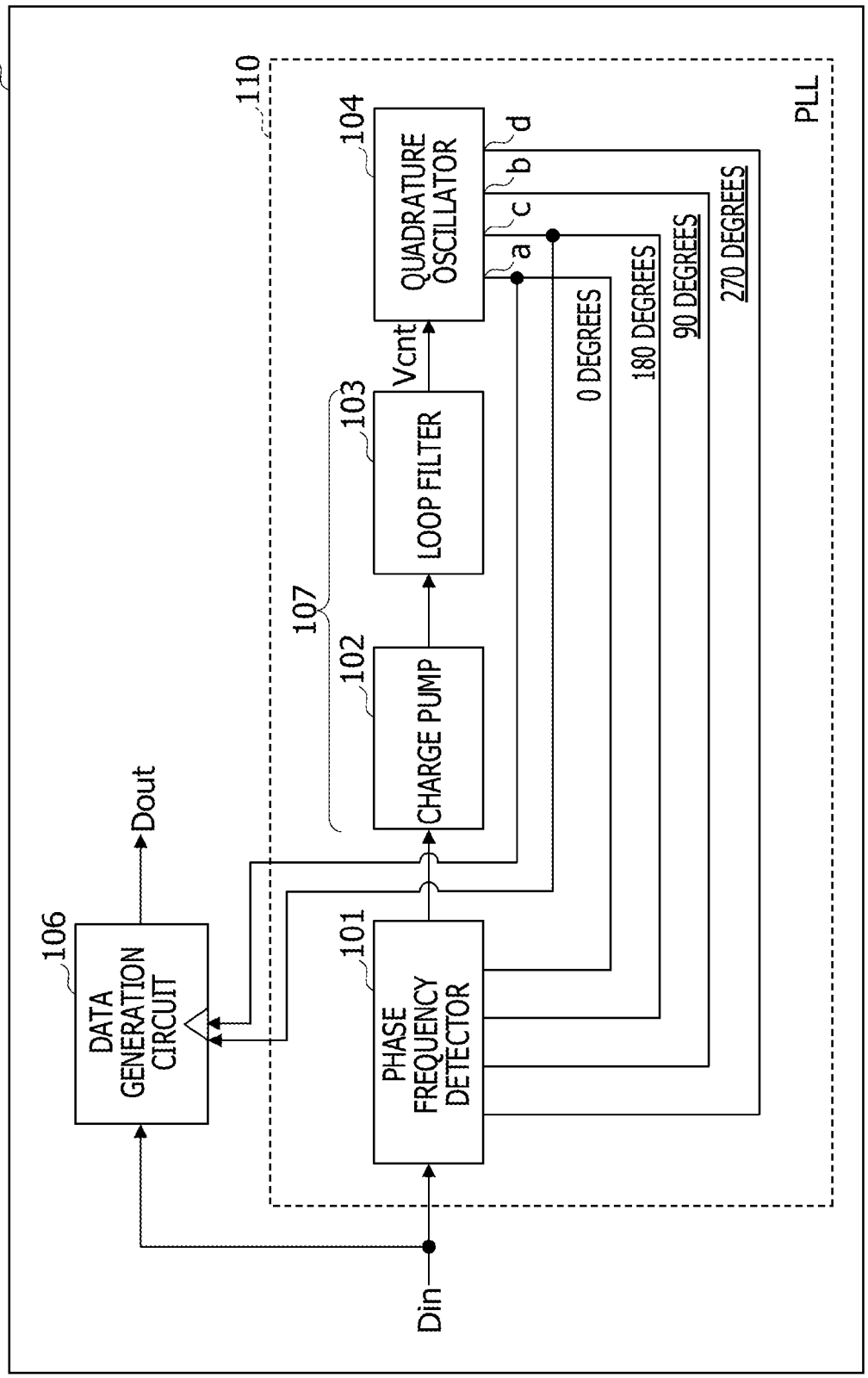
FIG. 29 illustrates an example configuration of CDR sections.

FIG. 29 illustrates a configuration of a CDR circuit according to an embodiment. A CDR 221 may be applied to the CDR section 503 in the send circuit 500 and the CDR section 403 in the receive circuit 400.

The CDR section 221 recovers a clock and data Dout from a received data signal Din on which the clock is superimposed. The CDR section 221 includes a phase-locked loop (PLL) circuit 110 and a data generation circuit 106. The PLL circuit 110 includes a quadrature oscillator 104, a phase frequency detector 101, and a control voltage generation circuit 107. To the quadrature oscillator 104, a quadrature oscillator according to one embodiment may be applied. The control voltage generation circuit 107 includes a charge pump 102 and a loop filter 103.

The quadrature oscillator 104 outputs an I-phase differential signal (a 0-degree clock and a 180-degree clock) from a pair of output terminals a and c, and outputs a Q-phase differential signal (a 90-degree clock and a 270-degree clock) from a pair of output terminals b and d.

The phase frequency detector 101 uses the I-phase differential signal and the Q-phase differential signal to compare the phase of a received data signal Din with the phase of the I-phase differential signal. The phase frequency detector 101 uses the I-phase differential signal and the Q-phase differential signal to compare the frequency of a received data signal Din with the frequency of the I-phase differential signal.

The phase frequency detector 101 generates a phase detection signal PDI that indicates a result of a comparison of the phase of a received data signal Din and the phase of an I-phase differential signal, and a frequency detection signal FDO that indicates a result of a comparison of the frequency of the received data signal Din and the frequency of the I-phase differential signal. The phase frequency detector 101 outputs the generated phase detection signal PDI and frequency detection signal FDO to the charge pump 102.

Figure 30:
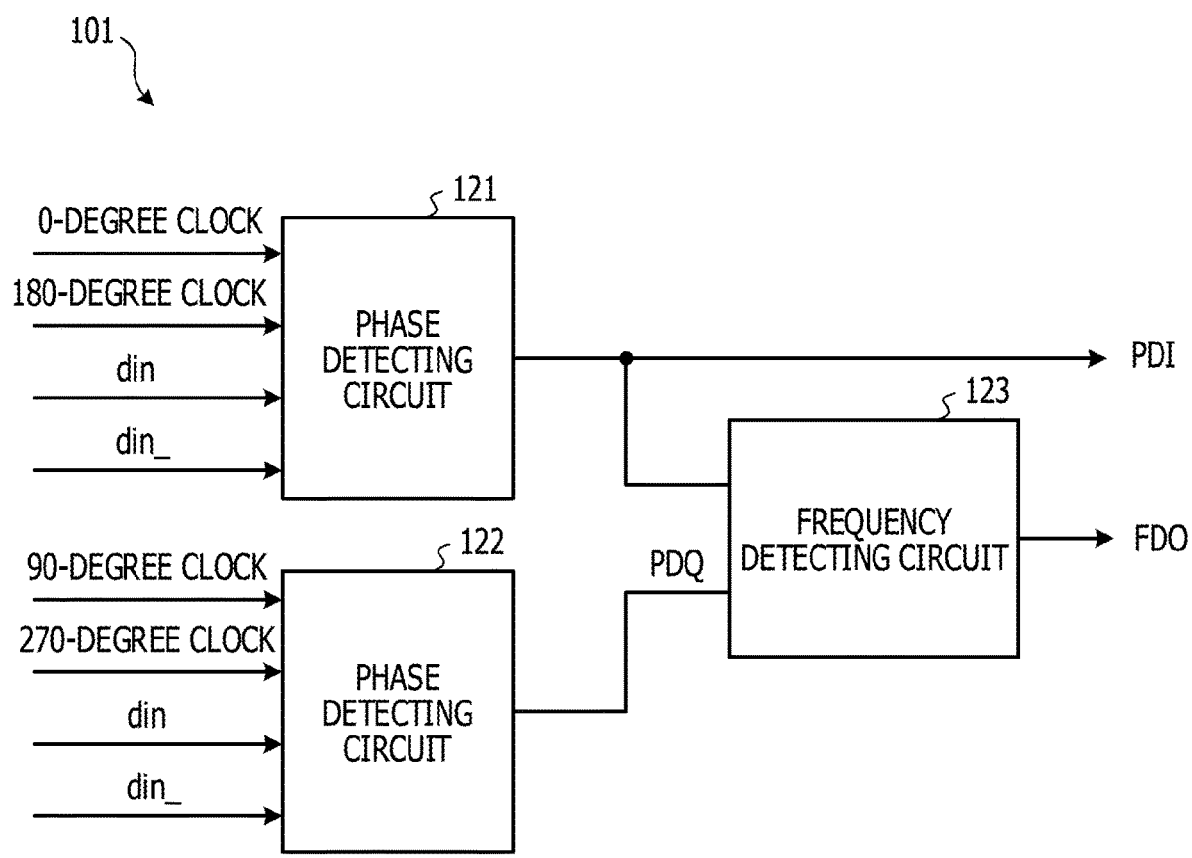
FIG. 30 illustrates a configuration of a phase frequency detector.

FIG. 30 illustrates a configuration of the phase frequency detector. The phase frequency detector 101 includes a first phase detecting circuit 121, a second phase detecting circuit 122, and a third frequency detecting circuit 123. The first phase detecting circuit 121, the second phase detecting circuit 122, and the third frequency detecting circuit 123 have known configurations. For example, two sample and hold circuits (latch circuits) and a multiplexer may constitute a first differential-type phase detecting circuit and a second differential-type phase detecting circuit. Alternatively, for example, two latch circuits and a modified multiplexer may constitute a differential-type frequency detecting circuit.

The received data signal Din to be input to the phase frequency detector 101 includes differential data signals din and din_ that have opposite phases. The phase detecting circuit 121 outputs a first phase detection signal PDI corresponding to a phase difference between a received data signal Din and an I-phase differential signal. Specifically, the phase detecting circuit 111 generates a first phase detection signal PDI that indicates whether change edges of an I-phase differential signal (a 0-degree clock and a 180-degree clock) lead or lag with respect to change edges of a differential data signals din and din_. The phase detecting circuit 122 outputs a second phase detection signal PDQ corresponding to a phase difference between a received data signal Din and a Q-phase differential signal. Specifically, the phase detecting circuit 122 generates a second phase detection signal PDQ that indicates whether change edges of a Q-phase differential signal (a 90-degree clock and a 270-degree clock) lead or lag with respect to change edges of differential data signals din and din_.

The frequency detecting circuit 123 generates a frequency detection signal FDO from a direction of a change edge of a phase detection signal PDI and a value of a phase detection signal PDQ that has been latched at the change edge of the phase detection signal PDI. The frequency detection signal FDO indicates whether the frequency of an I-phase differential signal is lower or higher than the frequency of a received data signal Din. The frequency detection signal FDO indicates +1 when the frequency of the I-phase differential signal is lower than the frequency of the received data signal Din, indicates −1 when higher, and indicates 0 when the same. The phase detection signal PDI and the frequency detection signal FDO are supplied to the charge pump 102 (see FIG. 29).

The charge pump 102 uses the phase detection signal PDI and the frequency detection signal FDO supplied from the phase frequency detector 101 to generate a signal for compensating the phase difference and the frequency difference between the received data signal Din and the I-phase differential signal. The charge pump 102 outputs an up signal Up to the loop filter 103 when the charge pump 102 has determined that the phases of the I-phase differential signal are lagging behind the phases of the received data signal Din or when determined that the frequency of the I-phase differential signal is lower than the frequency of the received data signal Din. On the other hand, the charge pump 102 outputs a down signal Down to the loop filter 103 when the charge pump 102 has determined that the phases of the I-phase differential signal are leading the phases of the received data signal Din or when determined that the frequency of the I-phase differential signal is higher than the frequency of the received data signal Din.

The loop filter 103 supplies a control voltage Vcnt for adjusting the frequencies and the phases of the I-phase differential signal and the Q-phase differential signal to the LC tanks in the quadrature oscillator 104. The control voltage Vcnt allows fine adjustment of the frequencies and the phases of the I-phase differential signal and the Q-phase differential signal.

The loop filter 103 varies the control voltage Vcnt to be supplied to the quadrature oscillator 104 in accordance with an up signal UP or a down signal Down supplied from the charge pump 102. The loop filter 103 increases the control voltage Vcnt to be supplied to the quadrature oscillator 104 in accordance with an up signal UP from the charge pump 102. The increased control voltage Vcnt causes the phase of the I-phase differential signal to advance and the frequency of the I-phase differential signal to increase. The loop filter 103 decreases the control voltage Vcnt to be supplied to the quadrature oscillator 104 in accordance with a down signal Down from the charge pump 102. The decreased control voltage Vcnt causes the phase of the I-phase differential signal to delay and the frequency of the I-phase differential signal to decrease.

The quadrature oscillator 104 generates an I-phase differential signal that has a frequency and phases that have been finely adjusted in accordance with the control voltage Vcnt supplied from the loop filter 103 and a Q-phase differential signal that has phases inverted with respect to the I-phase differential signal.

The data generation circuit 106 is, for example, a data flip-flop. The data generation circuit 106 samples a received data signal Din in accordance with an I-phase differential signal output from the quadrature oscillator 104 to recover data Dout from the received data signal Din.

The embodiments of the quadrature oscillation circuits, the FSK modulator, and the optical module have been described, but the present disclosure is not limited to the embodiments. The various changes and alterations such as combinations or replacements with parts or all of another embodiment may be made hereto without departing from the spirit and scope of the disclosure.

For example, a quadrature oscillator may include both of a frequency control circuit that controls a resonance frequency of an odd multiple, and a Q-value control circuit that controls Q values of harmonic resonators.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A quadrature oscillator comprising:
a first oscillator that outputs a first differential signal; and
a second oscillator that outputs a second differential signal having phases that are different from those of the first differential signal,
wherein the first oscillator includes a first LC resonator having an inductor and a capacitor coupled in parallel, a first cross-coupled circuit having a first pair of cross-coupled transistors coupled to the first LC resonator, a first tail current source coupled to the first pair of transistors, first input differential pair transistors to which the second differential signal is to be input, and a first pair of harmonic resonators disposed in input sections of the first input differential pair transistors,
the second oscillator includes a second LC resonator having an inductor and a capacitor coupled in parallel, a second cross-coupled circuit having a second pair of cross-coupled transistors coupled to the second LC resonator, a second tail current source coupled to the second pair of transistors, second input differential pair transistors to which the first differential signal is to be input, and a second pair of harmonic resonators disposed in input sections of the second input differential pair transistors,
the first pair of the harmonic resonators have a resonance frequency of an odd multiple of a resonance frequency of the first oscillator, and
the second pair of the harmonic resonators have a resonance frequency of an odd multiple of a resonance frequency of the second oscillator.

2. The quadrature oscillator according to claim 1, wherein each of the first pair of the harmonic resonators and the second pair of the harmonic resonators has an inductor and a capacitor that are coupled in series.

3. The quadrature oscillator according to claim 2, wherein the capacitor in each of the first pair of the harmonic resonators is capacitance between the base and the collector or between the gate and the drain of each of the first input differential pair transistors; and
the capacitor in each of the second pair of the harmonic resonators is capacitance between the base and the collector or between the gate and the drain of each of the second input differential pair transistors.

4. The quadrature oscillator according to claim 2, further comprising:
a control circuit that changes the capacitance of each of the first pair of the harmonic resonators and the second pair of harmonic resonators.

5. The quadrature oscillator according to claim 1, further comprising:
a control circuit that changes a value of the tail current supplied by the first tail current source and a value of the tail current supplied by the second tail current source.

6. The quadrature oscillator according to claim 2, further comprising:
a control circuit that changes the inductance of the inductor in each of the first pair of the harmonic resonators and the second pair of the harmonic resonators.

7. The quadrature oscillator according to claim 6,
wherein the control circuit changes the inductance by a transformer.

8. The quadrature oscillator according to claim 1,
wherein each of the first pair of the harmonic resonators and the second pair of the harmonic resonators has an inductor, a capacitor, and a resistor that are coupled in series, and
the quadrature oscillator further comprises a control circuit that changes a resistance value of the resistor.

9. The quadrature oscillator according to claim 8,
wherein the resistor is a MOSFET, and
the control circuit changes the resistance value by operating the MOSFET in a linear region.

10. The quadrature oscillator according to claim 1, further comprising:
a frequency control circuit that controls the resonant frequency of an odd multiple.

11. The quadrature oscillator according to claim 1, further comprising:
a Q-value control circuit that controls Q values of the first pair of the harmonic resonators and the second pair of harmonic resonators.

12. An FSK modulator comprising:
a first oscillator that outputs a first differential signal;
a second oscillator that outputs a second differential signal having phases that are different from those of the first differential signal; and
a drive circuit,
wherein the first oscillator includes a first LC resonator having an inductor and a capacitor coupled in parallel, a first cross-coupled circuit having a first pair of cross-coupled transistors coupled to the first LC resonator, a first tail current source coupled to the first pair of transistors, first input differential pair transistors to which the second differential signal is to be input, and a first pair of harmonic resonators disposed in input sections of the first input differential pair transistors,
the second oscillator includes a second LC resonator having an inductor and a capacitor coupled in parallel, a second cross-coupled circuit having a second pair of cross-coupled transistors coupled to the second LC resonator, a second tail current source coupled to the second pair of transistors, second input differential pair transistors to which the first differential signal is to be input, and a second pair of harmonic resonators disposed in input sections of the second input differential pair transistors,
the first pair of the harmonic resonators have a resonance frequency of an odd multiple of the resonance frequency of the first oscillator,
the second pair of the harmonic resonators have a resonance frequency of an odd multiple of the resonance frequency of the second oscillator, and
the drive circuit changes the capacitance of each of the first LC resonator and the second LC resonator so as to change the frequencies of the first differential signal and the second differential signal in accordance with an input data.

13. An optical module for sending, receiving, or sending and receiving an optical signal, the optical module comprising:
a first oscillator that outputs a first differential signal;
a second oscillator that outputs a second differential signal having phases that are different from those of the first differential signal; and
a CDR section that recovers a clock and data from a data signal in which the clock is superimposed in accordance with the first differential signal and the second differential signal,
wherein the first oscillator includes a first LC resonator having an inductor and a capacitor coupled in parallel, a first cross-coupled circuit having a first pair of cross-coupled transistors coupled to the first LC resonator, a first tail current source coupled to the first pair of transistors, first input differential pair transistors to which the second differential signal is to be input, and a first pair of harmonic resonators disposed in input sections of the first input differential pair transistors,
the second oscillator includes a second LC resonator having an inductor and a capacitor coupled in parallel, a second cross-coupled circuit having a second pair of cross-coupled transistors coupled to the second LC resonator, a second tail current source coupled to the second pair of transistors, second input differential pair transistors to which the first differential signal is to be input, and a second pair of harmonic resonators disposed in input sections of the second input differential pair transistors,
the first pair of the harmonic resonators have a resonance frequency of an odd multiple of the resonance frequency of the first oscillator, and
the second pair of the harmonic resonators have a resonance frequency of an odd multiple of the resonance frequency of the second oscillator.

* * * * *